US008429954B2

(12) United States Patent
Clark

(10) Patent No.: US 8,429,954 B2
(45) Date of Patent: Apr. 30, 2013

(54) MONOLITHIC COMB DRIVE SYSTEM AND METHOD FOR LARGE-DEFLECTION MULTI-DOF MICROTRANSDUCTION

(75) Inventor: Jason Vaughn Clark, West Lafayette, IN (US)

(73) Assignee: Purdue Research Foundation, West Lafatette, IN (US)

( * ) Notice: Subject to any disclaimer, the term of this patent is extended or adjusted under 35 U.S.C. 154(b) by 873 days.

(21) Appl. No.: 12/456,759

(22) Filed: Jun. 22, 2009

(65) Prior Publication Data

US 2010/0064395 A1    Mar. 11, 2010

Related U.S. Application Data

(63) Continuation-in-part of application No. 12/075,503, filed on Mar. 12, 2008, now Pat. No. 7,721, 587.

(60) Provisional application No. 60/906,355, filed on Mar. 12, 2007, provisional application No. 61/132,663, filed on Jun. 20, 2008.

(51) Int. Cl.
*G01B 5/28* (2006.01)

(52) U.S. Cl.
USPC .............................. 73/105; 73/1.79

(58) Field of Classification Search ............ 73/105, 73/1.79
See application file for complete search history.

(56) References Cited

U.S. PATENT DOCUMENTS

| 5,445,006 | A |  | 8/1995 | Allen et al. |  |
|---|---|---|---|---|---|
| 5,656,769 | A | * | 8/1997 | Nakano et al. | 73/105 |
| 5,703,754 | A |  | 12/1997 | Hinze |  |
| 6,189,374 | B1 |  | 2/2001 | Adderton et al. |  |
| 6,223,591 | B1 | * | 5/2001 | Nakano | 73/105 |
| 6,780,664 | B1 |  | 8/2004 | Goruganthu et al. |  |
| 7,111,504 | B2 |  | 9/2006 | Blumberg et al. |  |
| 7,481,099 | B2 | * | 1/2009 | Amakusa | 73/105 |
| 2005/0081363 | A1 |  | 4/2005 | Malshe et al. |  |
| 2005/0241394 | A1 |  | 11/2005 | Clark |  |
| 2007/0044545 | A1 |  | 3/2007 | Beyder et al. |  |
| 2007/0194225 | A1 | * | 8/2007 | Zorn | 250/306 |

OTHER PUBLICATIONS

Shapiero, B. (edited by), "Control and System Integration of Micro- and Nano-scale Systems", Report from the National Science Foundation workshop, Mar. 29-30, 2004, 108 pages.
Clark, J.V., "Electo Micro-Metrology", Ph.D. dissertation, Fall 2005, U.C. Berkeley, pp. 11-219.
"MEMS standards, while small, may mean much for the industry", Small Times, Aug. 26, 2003, pp. 1-2.
Green, J. and Krakauer, D., "New iMEMS Angular Rate-Sensing Gyroscope," Analog Dialogue, 37-03, 2003.

* cited by examiner

*Primary Examiner* — John Fitzgerald
*Assistant Examiner* — Rodney T Frank
(74) *Attorney, Agent, or Firm* — Faegre Baker Daniels LLP

(57) ABSTRACT

A scanning probe microscope includes a plate moveable in an x-axis direction, a y-axis direction, and a z-axis direction, and a probe tip coupled to the plate. A plurality of actuators cooperate to move the probe tip with three degrees of freedom of movement.

20 Claims, 38 Drawing Sheets

MONOLITHIC COMB DRIVE SYSTEM AND METHOD FOR LARGE-DEFLECTION MULTI-DOF MICROTRANSDUCTION

CROSS REFERENCE TO RELATED APPLICATION

This application is a continuation-in-part of U.S. patent application Ser. No. 12/075,503, filed Mar. 12, 2008 now U.S. Pat. No. 7,721,587, which claims the benefit of U.S. Provisional Application Ser. No. 60/906,355, filed Mar. 12, 2007, and this application also claims the benefit of U.S. Provisional Patent Application Ser. No. 61/132,663, filed Jun. 20, 2008, the disclosures of which are expressly incorporated by reference herein.

BACKGROUND AND SUMMARY

The present invention relates to an apparatus and method for improving the precision of nanoscale force-displacement measurements. Nanotechnology has great potential for being used to create new and improved medicines, materials, sensors, and devices through molecular-scale engineering. The rate of such advancements depends on our ability to understand nanoscale phenomena. Therefore, with increasing interest in nanotechnology to improve the quality of our lives, there has been increasing interest in force-displacement measurements to improve our understanding of nanoscale phenomena.

Large uncertainties exist in conventional measurement tools which cause a bottleneck to technological advancements. For instance, large uncertainties make it difficult to: 1) resolve important subtleties during the research phase; 2) verify or develop predictive models during the design phase; and 3) develop testing standards for the commerce phase. For example, most measurement tools only yield about two significant digits of accuracy. It is often quite difficult to match the mathematical physics of a simulation with an experiment when the experiment has such large relative error. Due to these large uncertainties, the industry has been slow to develop a consensus on the methods or the tools that are used to measure geometric properties, dynamic properties and material properties at the micro and nano-scale.

When engineering such micro and nano-scale systems, adequate computer aided design/engineering tools and metrology tools are needed. Metrology is the science of measurement. Scientists may discover a new nano-scale phenomenon and then try to exploit properties of the discovered phenomenon. The next step is understanding the discovered phenomenon. Scientists do this by developing a theory based on the physics that they understand at the time. Then, scientists try to match the theory with experiment. The next step is to build computer-efficient models of a phenomenon. Parameters are from metrology. The next step is to assemble the models developed into a system level simulation to try to predict the outcome of a new device. Often times, discovery which leads to an invention is made at this step. The next step is realization and finally, verification where metrology is used once again to see how well simulation has predicted reality. Metrology is used throughout this process which indicates its importance.

Two illustrative types of metrology are displacement and force. One of the most important nanoscale tools is the atomic force microscope (AFM), which is used to measure forces on the order of tens of piconewtons (similar to the force necessary to rupture DNA), used as a positioner, and used to measure displacements on the order of tenths of nanometers (similar to the size of atoms). However, precise calibration of the AFM has been difficult (~1-15% precision). The AFM is not sensitive enough to precisely characterize more subtle phenomena such as the van der Waals forces involved in protein folding (~$10^{-12}$ N), the quantum vacuum forces involved in the Casimir effect (~$10^{-13}$ N), or the Langevin forces involved in Brownian motion of bacterium (~$10^{-14}$ N). Currently, subtle nanoscale phenomena are beyond precise verification and characterization, or possibly worse, beyond discovery.

When measuring force, a conventional mass balance can measure forces to a level of about a micro-Newton ($10^{-6}$ N), which is illustratively equivalent to solar radiation per $m^2$ near earth. A conventional AFM can measure forces to a level of about a hundredth of a nano-Newton, illustratively the gravitational force between two 1 kg masses 1 m apart ($10^{-11}$ N). The improved force sensor of the present invention using the EMM calibration method can measure forces to a level of a pico-Newton, illustratively the light pressure of a 1 mW laser pointer or the forces due to protein folding, or even less in the range of $10^{-13}$ N to $10^{-16}$ N.

The range of force precision is illustratively from micronewtons to femtonewtons. As illustrated in the below, the range if EMM is used is indicated by the bar labeled "EMM". For comparison, the range of the atomic force microscope (AFM) and mass balance are also show.

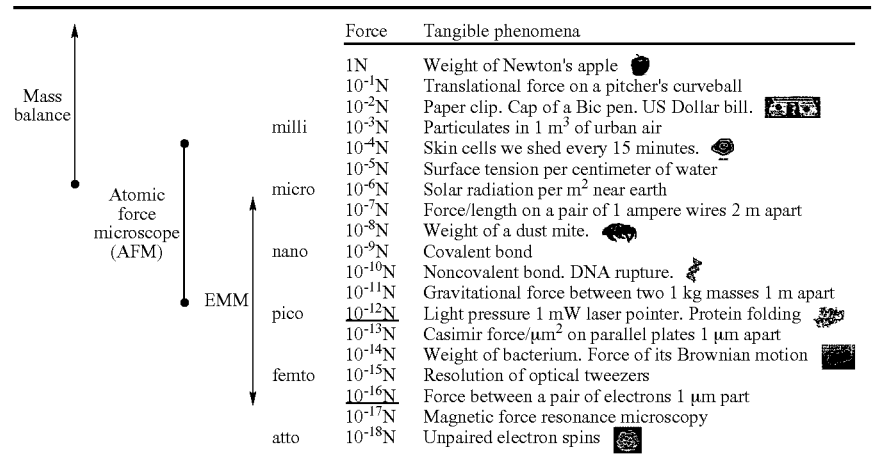

The atomic force microscope or AFM is the most popular nanoscale force detection tools used today. It consists of a cantilever, a very sharp probe tip and a laser beam which reflects off of the end of the cantilever onto a photodiode. Interaction forces between the tip and the target surface cause the cantilever to deflect. That small deflection is amplified by the reflecting laser light onto the photodiode which is used to measure that deflection. Knowing the deflection and knowing the stiffness of the cantilever allows one to measure force. The resolution of force of an AFM is on the order of 10 pico-Newtons. The AFM is also used as a positioner with a resolution of about a nano-meter.

Components of an AFM system include a cantilever, a laser diode, a mirror, a position sensitive photodetector, a feedback loop, piezoelectric scanner to move the sample, and a computer which performs the data acquisition, display and analysis.

There are many ways to calibrate the AFM cantilever. Three of the most popular are the thermal method, the added mass method and the unload resonance technique. There is no calibration standard and most conventional calibration methods yield about 1-15% uncertainty.

The illustrated apparatus and method of the present invention significantly increases the ability of scientists and engineers to sense and actuate at the nanoscale by several orders of magnitude. The present apparatus and method may benefit branches of biology, physics, chemistry, and engineering.

The present calibration system and method uses Electro Micro-Metrology (EMM) techniques, which are substantially more precise and practical than convention. Precise geometric, dynamic, and material properties at the micro/nanoscale can be extracted using electronic measurands. This is based on leveraging the sensitive electrical-mechanical coupling of microsystems to measure and characterize themselves.

In one illustrated embodiment, the present invention provides an on-chip, self-characterization method that differs from conventional metrology methods, which adapt macroscale tools and techniques to the micro/nanoscale, and which do not precisely determine the geometry and material properties due to process variation. EMM has several benefits over conventional methods as follows: 1) EMM does not rely on unconfirmed geometrical and material properties; 2) A multitude of properties can be extracted; 3) Uncertainties are much smaller and well-characterized, i.e. much more than two significant digits are attainable; 4) EMM measurements are performance-based and may lead to micro/nanoscale testing standards; 5) EMM's precision is reliable and repeatable; 6) EMM is nondestructive; 7) EMM is low cost; 8) The apparatus is small, lightweight, and portable; 9) It is automatable and amenable to industrial batch processing; 10) EMM is low-power; 11) EMM can be calibrated after packing, after a harsh environmental change, or after long-term dormancy; 12) The measurements are local; 13) Only a few test structures and a small amount of chip real estate are required; and 14) EMM is easier to use and measurements can be performed more quickly than convention.

Electro Micro Metrology (EMM) methods allow extraction of geometric, dynamic and material properties solely as functions of electrical measurands such as change of capacitance, change in voltage and/or change in frequency.

Geometric Properties Include:
1. Overetch
2. Sidewall angle
3. Gap spacing
4. Beam length
5. Area
6. Layer thickness
7. Beam width
8. Elongation
9. Comb finger offset
10. Etch hole Dynamic Properties Illustratively Include:
1. Comb drive force
2. Displacement
3. System stiffness
4. Damping factor
5. Natural frequency
6. System mass
7. System damping
8. Velocity resonance
9. Displacement Amplitude
10. Quality factor Material Properties Illustratively Include:
1. Base compliance
2. Webbing stiffness
3. Beam stiffness
4. System modulus
5. Shear modulus
6. Poisson's ratio
7. Strain
8. Stress
9. Material density
10. Material Young's Modulus In an illustrated embodiment of the present invention, a method is provided for improving precision of a nano-scale sensor. The method comprises fabricating a sensor on an integrated circuit chip, the sensor having at least one unknown property due to a fabrication process, determining the at least one unknown property of the sensor as a function of at least one electrical measurand associated with the sensor, precisely measuring the electrical measurand associated with the sensor, calculating the at least one unknown property of the sensor based upon the precisely measured electrical measurand, and using the at least one calculated property of the sensor to improve precision of the sensor.

In another illustrated embodiment of the present invention, a self-calibrating apparatus comprises a primary device fabricated on an integrated circuit chip. The primary device has at least one unknown property due to a fabrication process of the integrated circuit chip. The apparatus also comprises a test structure fabricated on the same integrated circuit chip as the primary device. The test structure has the same material properties as the primary device so that the test structure also has the same at least one unknown property as the primary device. The apparatus further comprises a electrical measurand sensor configured to measure an electrical measurand of the test structure, and a controller coupled to the primary device and electrical measurand sensor. The controller includes means for calculating the at least one unknown property of the test structure based on the measured electrical measurand. The controller uses the calculated at least one unknown property to calibrate the primary device.

In an exemplary embodiment, the electrical measurand sensor is fabricated on the same chip as the primary device and the test structure. The controller may also fabricated on the same chip as the primary device, the test structure, and the electrical measurand sensor. Illustratively, the at least one unknown property may comprises at least one of Young's modulus, density, stress, stain gradient, a geometrical error, viscosity, and stiffness.

In yet another illustrated embodiment of the present invention, an atomic force microscope having three degrees of freedom of movement comprises first and second anchors rigidly coupled to a substrate, first and second flexures coupled to the first and second anchors, respectively, a first plate coupled to the first flexure, a first drive actuator coupled to the first plate, and an electrode coupled to the first plate. The atomic force microscope further comprises a second plate coupled to the first plate by a third flexure, a third plate coupled to the first plate by at least one structures, the third plate also being coupled to the second anchor by the second flexure, a second drive actuator located between the second and third plates, and a probe tip coupled to the second plate. The first and second flexures and the first drive actuator provide a first degree of freedom, the electrode provides a second degree of freedom, and the third flexure and the second drive actuator provide a third degree of freedom.

To help extend the investigation and exploitation of nanometer-scale phenomena, there is a need for high precision, large deflection microtransducers with multiple degrees of freedom (DOF). To sense and actuate in three dimensions, the illustrated device includes three types of comb drives: a vertical comb drive, a planar comb drive, and a planar monolithic comb drive, which operates as an in-situ RC circuit. The two planar comb drives are illustratively used to translate a proof mass with independent in-plane x- and y-directions, and the vertical comb drive translates the proof mass in the out-of-plane z-direction. The device resists rotation about the z axis. Precise sensing and actuation by using high-precision capacitance and voltage to detect position and to apply force, respectively, is disclosed herein. In an illustrated embodiment, the geometry of the transducer may be one structural layer, which is amenable to a one-mask embodiment fabrication process such as silicon-on-insulator (SOI) process.

The present disclosure presents a multi-degree of freedom, large deflection transducer with a monolithic comb drive. The illustrated microtransducer includes an actuator called a "monolithic comb drive". This particular drive has a stator and a shuttle which are illustratively both electrically and mechanically integrated into a single continuous structure. Unlike the conventional comb drive that comprises a stator and rotor that are disconnected, the monolithic comb drive of the present disclosure includes a stator and shuttle that are mechanically connected and may translate as a whole. Since comb drives are amenable to large and precise deflections, the additional degree of freedom afforded by the monolithic comb drive is applicable to micrometer and nanometer-scale positioning.

Nanopositioners are mechatronic systems designed to move objects over a small range with a resolution on the order of a nanometer or less. Nanopositioners that are in use include the family of scanning probe microscopes (SPMs) such as the scanning tunneling microscope (STM) and the atomic force microscope (AFM). The vast range of potential future applications includes nanofabrication, biological interrogation, data storage, and space telescopes. For example, nanopositioners are expected to play prominent rolls in nanometer-scale manufacturing through wafer alignment and positioning, nanomaterials testing, nanoassembly, and radiation alignment systems. Nanopositioners may be used in biological science through imaging, manipulation, cell tracking, and DNA analysis. Nanopositioners may also be used to improve data storage through hard-disk servo systems, and enabling high-density probe-based data storage.

There are several types of actuators for nanopositioners. A few illustrated examples of nanopositioning mechanisms include piezoelectric, magnetostrictive, magnetic levitation, electrostatic comb, electrostatic gap closing, electrostatic surface, electrostatic shuffle, electromagnetic, and thermal actuators. Position sensing of such actuators is typically carried out by measured changes in voltage, capacitance, current, or resistance. The choice of mechanism for nanopositioning depends on the target application and the desired performance of the positioner. For instance, piezoelectric and magnetostrictive actuators achieve large actuation forces but are limited to small displacement ranges. Electrostatic surface and shuttle actuators achieve large displacements but are difficult to precisely characterize. Conventional electrostatic comb actuators achieve large deflections but are one-dimensional.

An increasing number of researchers are requiring greater than 10 microns of deflection, smaller than 10 nanometers of displacement resolution, smaller than 100 piconewtons of force resolution, and better than 5-15% relative error in mechanical stiffness. Toward addressing such needs, the nanopositioning mechanism of the present disclosure extends the large-deflection attribute of conventional electrostatic comb actuators by adding an additional degree of freedom of movement. High-precision capacitance measurement is expected to significantly reduce relative error.

In another illustrated embodiment of the present disclosure, a scanning probe microscope apparatus includes a probe tip coupled to a first plate moveable in an x-axis direction, a y-axis direction and a z-axis direction. The apparatus also includes a first actuator configured to move the plate and the probe tip in the y-axis direction, a second actuator configured to move the plate and the probe tip in a z-axis direction, and a third actuator configured to move the probe tip in the x-axis direction, The first, second and third actuators cooperate to move the probe tip with three degrees of freedom of movement.

In an illustrated embodiment, the first actuator includes a comb drive actuator coupled to a second plate, and the second plate is coupled to the first plate by at least one flexure. In an illustrated embodiment, the third actuator includes a comb drive having a first set of fingers coupled to a third plate. The first set of fingers coupled to third plate cooperates with a second set of fingers coupled to the first plate to move the first plate and the probe tip in the x-axis direction.

In another illustrated embodiment, a capacitance sensor configured to sense a change in capacitance upon engagement of the probe tip with a sample. A capacitance meter may be used to determine at least one of deflection of the probe tip and force applied to the probe tip.

In still another illustrated embodiment, a controller is configured to measure an electrical measurand to determine at least one of deflection of the probe tip and force applied to the probe tip. An electrostatic sensor is located at a point of largest vibration of the apparatus. The electrostatic sensor provides an output signal coupled to a controller to reduce the effect of noise-induced vibrations on the system.

The above-mentioned and other features of this invention, and the manner of attaining them, will become more apparent and the invention itself will be better understood by reference to the following description of illustrated embodiments of the invention taken in conjunction with the accompanying drawings.

BRIEF DESCRIPTION OF THE DRAWINGS

The above-mentioned and other features of this invention, and the manner of attaining them, will become more apparent and the invention itself will be better understood by reference to the following description of illustrated embodiments taken in conjunction with the accompanying drawings, wherein.

DETAILED DESCRIPTION OF THE DRAWINGS

Figure 1:
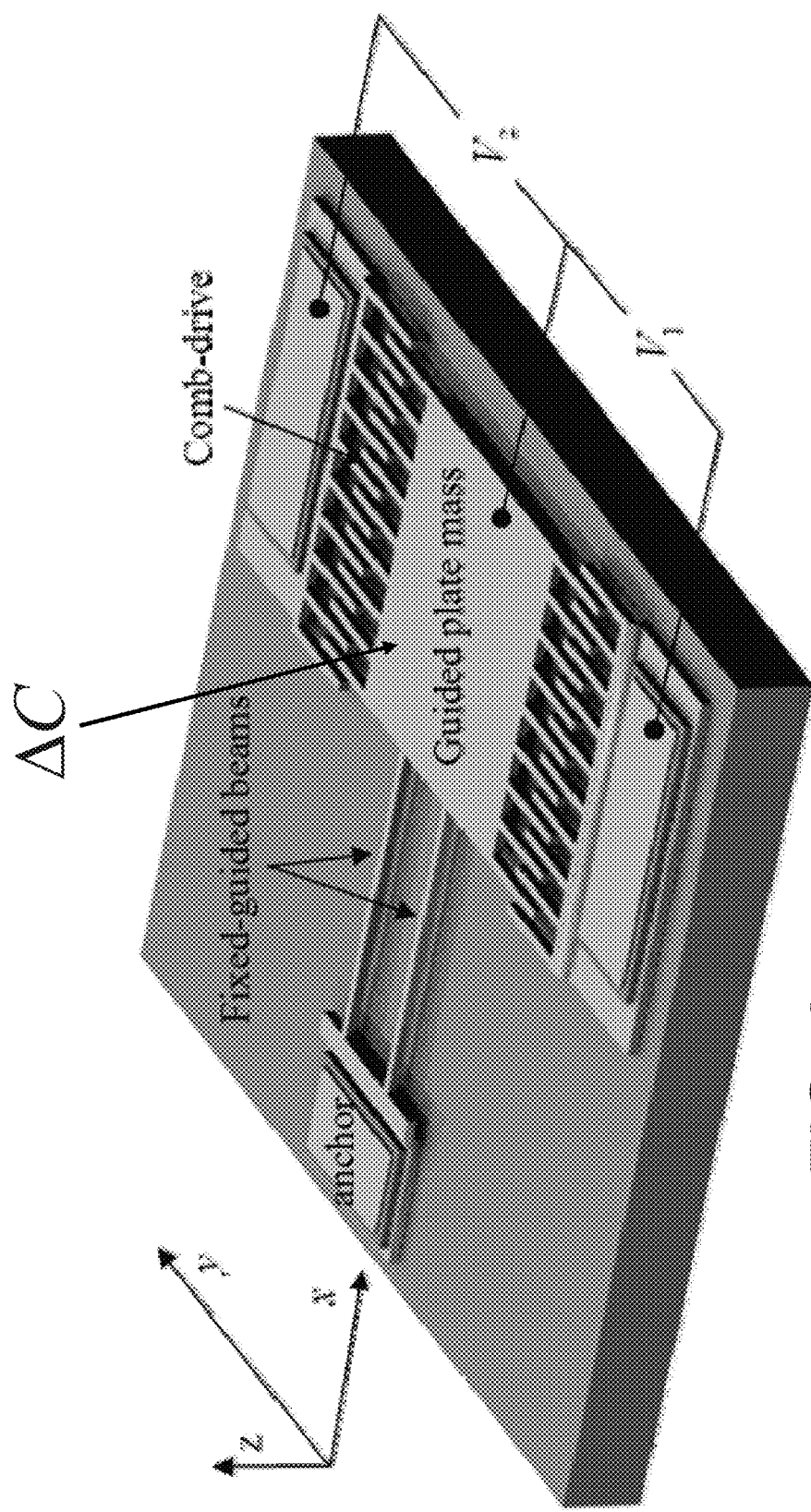
FIG. 1 is an illustrative test structure for electro micro metrology (EMM)

For the purposes of promoting an understanding of the principles of the invention, reference will now be made to certain illustrated embodiments and specific language will be used to describe the same. It will nevertheless be understood that no limitation of the scope of the invention is thereby intended. Such alterations and further modifications of the invention, and such further applications of the principles of the invention as described herein as would normally occur to one skilled in the art to which the invention pertains, are contemplated, and desired to be protected.

The illustrated apparatus and method of the present invention uses EMM to alleviate some of the metrology and modeling bottlenecks in nano-scale science and technology discussed above. Determining the fundamental properties of microdevices has been a longstanding problem at the micro/nano-scale. Properties vary from lab to lab, from run to run at the same lab, and from chip to chip across a single wafer.

To date, there are no nano-scale ASTM standards, and only two micro-scale ASTM standards: one for measuring cantilever length; and another for measuring cantilever strain gradient. There has been no consensus on methods to measure other properties—mostly due to the large uncertainties in the measurement techniques. In essence, the present system and method involves determining what geometric and material properties of an effective model are required to match the performance of the true device. These effective properties of the model are assumed to be the effective properties of the true device. This concept is exemplified in FIGS. 4 and 5, where a true cantilever is shown next to its ideal counterpart.

Electro Micro Metrology (EMM) exploits the strong and sensitive electromechanical coupling to extract mechanical properties X as functions of electronic measurands e. The property X can be a geometric, dynamic, or material property. The electronic measurand $\Delta e$ can be a change in capacitance, voltage, or frequency. From the Taylor expansion of analytical models, measurement has the mathematical form $$X(\Delta e \pm \delta e) = X(\Delta e) \pm \left[\frac{\partial X}{\partial \Delta e}\right] \delta e \qquad (1)$$

where $\delta e$ is the uncertainty in the electronic measurand. That is, $\delta e$ is the decimal place of the last flickering digit on the capacitance meter, which is the accumulation of all noise or the correlated noise floor (i.e. impinging air molecules, modulating electric fields, Brownian noise, etc.). The coefficient $(\partial X/\partial \Delta e)$ in (1) is the sensitivity between the mechanics and the electronics. This coefficient is what coverts the electronic uncertainty to a mechanical uncertainty. That is, the product $(\partial X/\partial \Delta e)\delta e$ is the uncertainty in mechanical measurement, $\delta X$, which is at once measurable and well-defined. In contrast, most micro/nanotechnologists have difficulty determining uncertainty, which leads to coarse approximations. Preliminary analysis shows that the sensitivity ($\partial X/$ ∂Δe) can be quite large—as high as $O(10^8)$. It is therefore necessary that the factor δe be much smaller. Fortunately, δe can be made to be much, much smaller—as small as $O(10^{-21})$. Using Analog Devices' result as a corroborating example, since the capacitance resolution δe=δC of their iMEMS gyro was on the order of a zeptofarad, and their displacement δX=δy was on the order of 100 femtometers, then their sensitivity is clearly $[\partial y/\partial \delta C]=10^8$. Worst case scenario, if Analog Devices' correlated noise floor was a thousand times greater, i.e. δC=attofarad, then their uncertainty in displacement would have been on the order of an Angstrom (the size of an atom), which is still respectable.

FIG. 1 illustrates a conventional EMM test structure. The test structure may be used in the examples that follow. The illustrated test structure includes comb drives, fixed guided beams which guide a plate mass, and an anchor at the opposite end of the fixed-guided beams. Once fabricated, the geometry material properties of test structure need to be determined.

Figure 2:
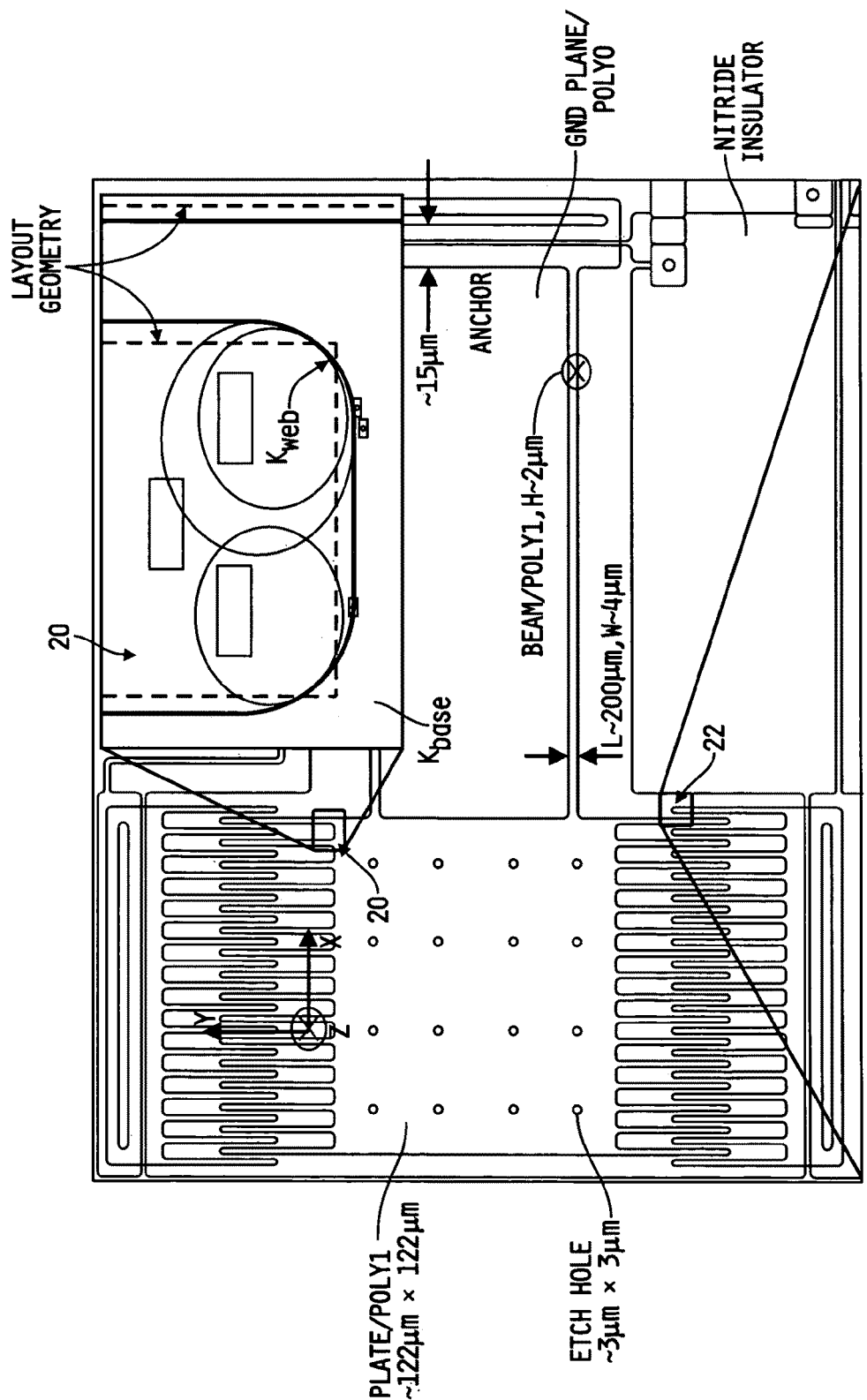
FIG. 2 is a fabricated version of the test structure of FIG. 1 with an enlarged portion to show a comparison between layout geometry and fabrication geometry.
Figure 3:
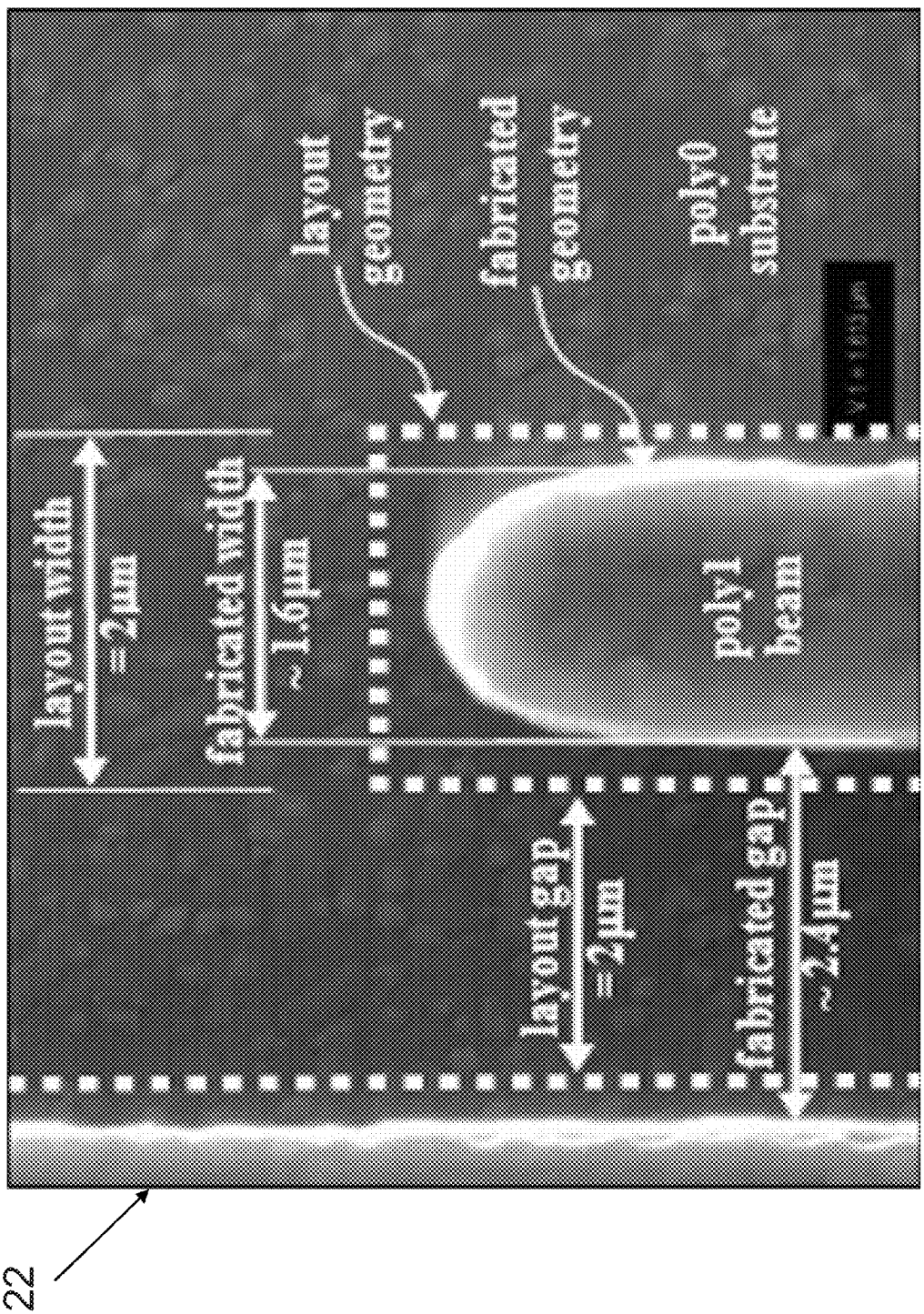
FIG. 3 is an enlarged view of another portion of the fabricated version of the test structure of FIG. 2.

FIG. 2 illustrates a fabricated version of the test structure of FIG. 1. The upper rectangle shows a magnified view of a comb finger in region 20 as it is attached to the plate. The dashed lines of the layout geometry shown not to match the actual fabricated geometry. FIG. 3 illustrates a magnified view of the tip of a finger of region 22 of FIG. 2. A close up of the gap in the tip of the comb finger are shown. Layout geometry is again shown as dashed lines. The gaps are larger and the widths of the fingers are smaller. This implies that both the capacitance and the stiffness are smaller then would have been predicted using only layout geometry. The difference in width of the support beams and electrostatic gaps significantly affect the ability to predict performance before the device is fabricated. It is also difficult to numerically match performance after the device is fabricated because conventional metrology techniques yield large uncertainties.

Beams are attached to anchors and plates both of which are not rigid. There is an area of compliance which in effect causes an additional rotation upon the deflection of a beam. The radius of compliance is that radius that beyond which produces no significant additional increase in that rotation. The problems caused by compliant plates and anchors and fillets can be alleviated by allowing the beams to flare out as it approach these interfaces.

Figure 4:
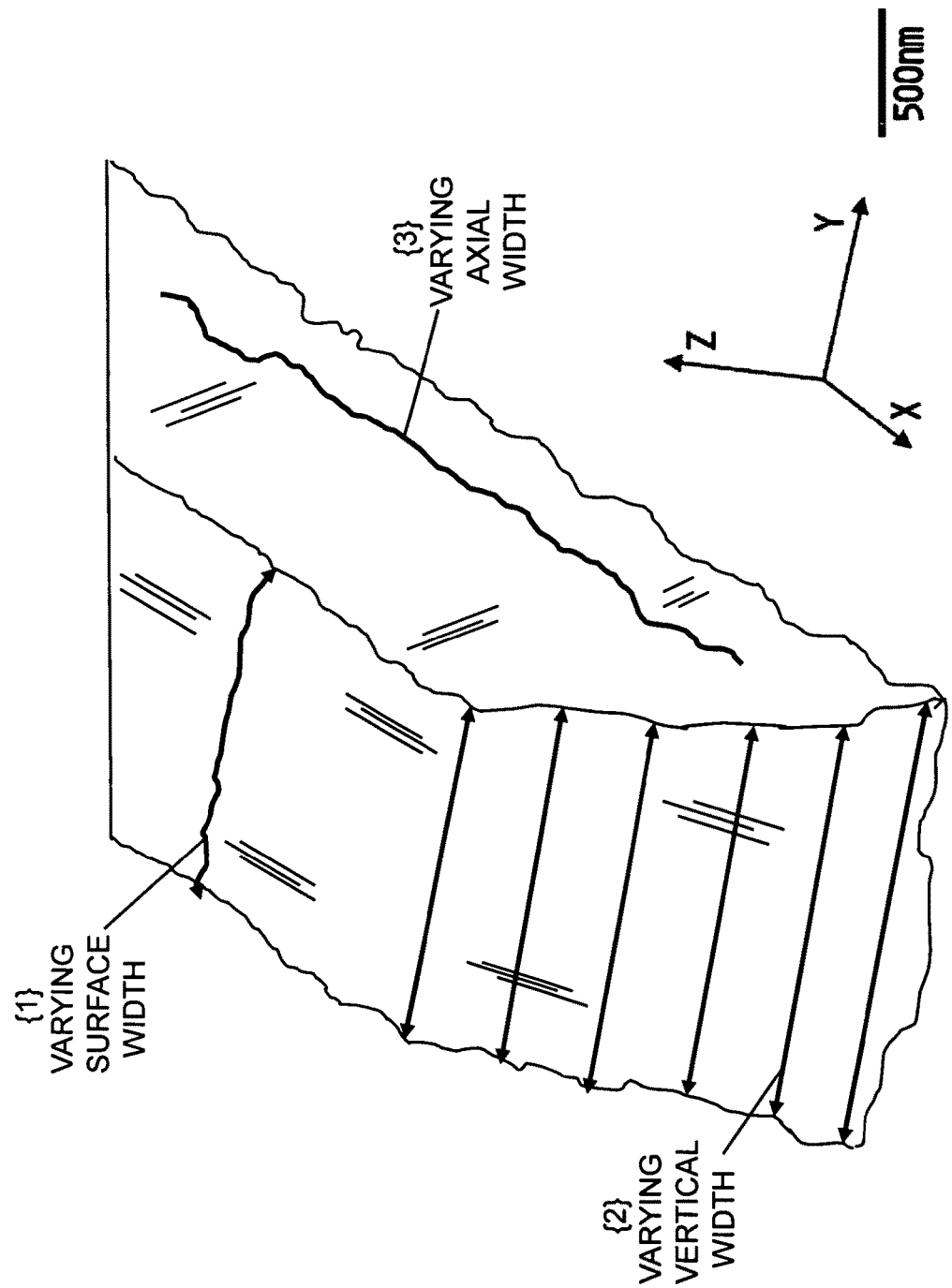
FIG. 4 is a cross-sectional view of a severed beam of a fabricated device illustrating variations in the geometry of the beam.

Another problem faced at the micro and nano-scale is the definition of geometry. FIG. 4 illustrates a cross section of a severed beam. This beam has varying axial widths, varying surface widths and along its cross-section, and varying vertical widths. These geometric variations make it difficult to determine an effective width of the beam.

Figure 5:
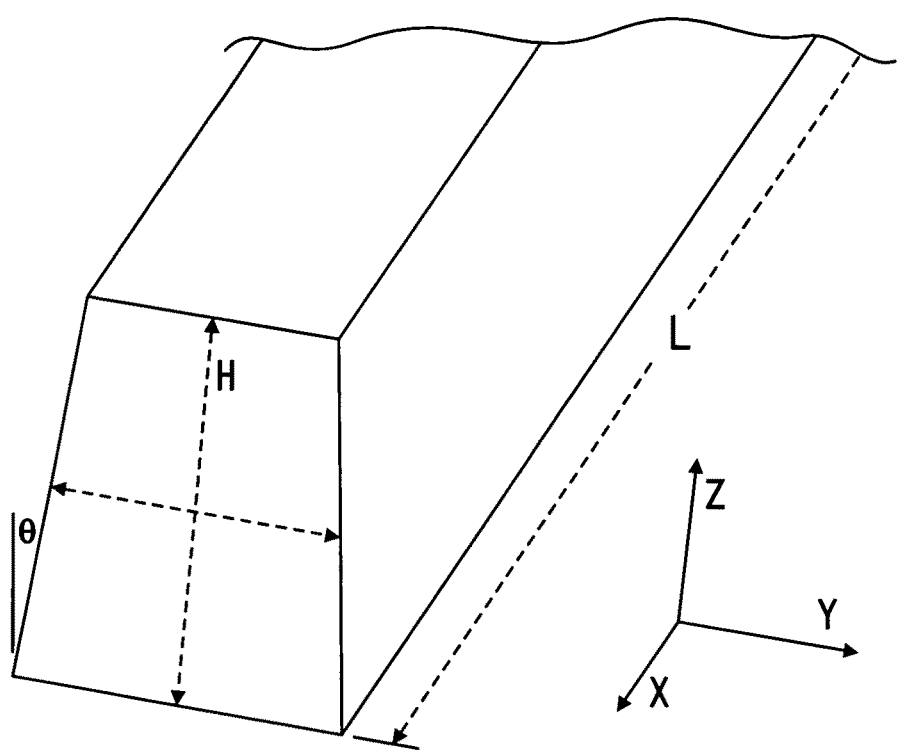
FIG. 5 is an experimentally accurate analytical model of the beam of FIG. 4.

EMM can be thought of as a way to determine the properties of a model such that it matches the performance of a true device. A model of the beam of FIG. 4 is shown in FIG. 5. If the same forces are applied to the beams and they yield the same deflections, then we say that the geometry and material properties of a model are assumed to be the effective geometry and material properties of the true device. In essence, what we have done is to create experimentally-accurate analytical model shown in FIG. 5. That is, given identically applied forces, EMM determines the geometric and material properties of the model that are required for it to precisely match the performance of the true device. The PI calls these properties performance-based, effective properties of the true structure. A common misconception is idea that the average value of profilometry can be used as beam width; however, since the second moment of area is nonlinear in width, supper position cannot be applied.

Figure 6:
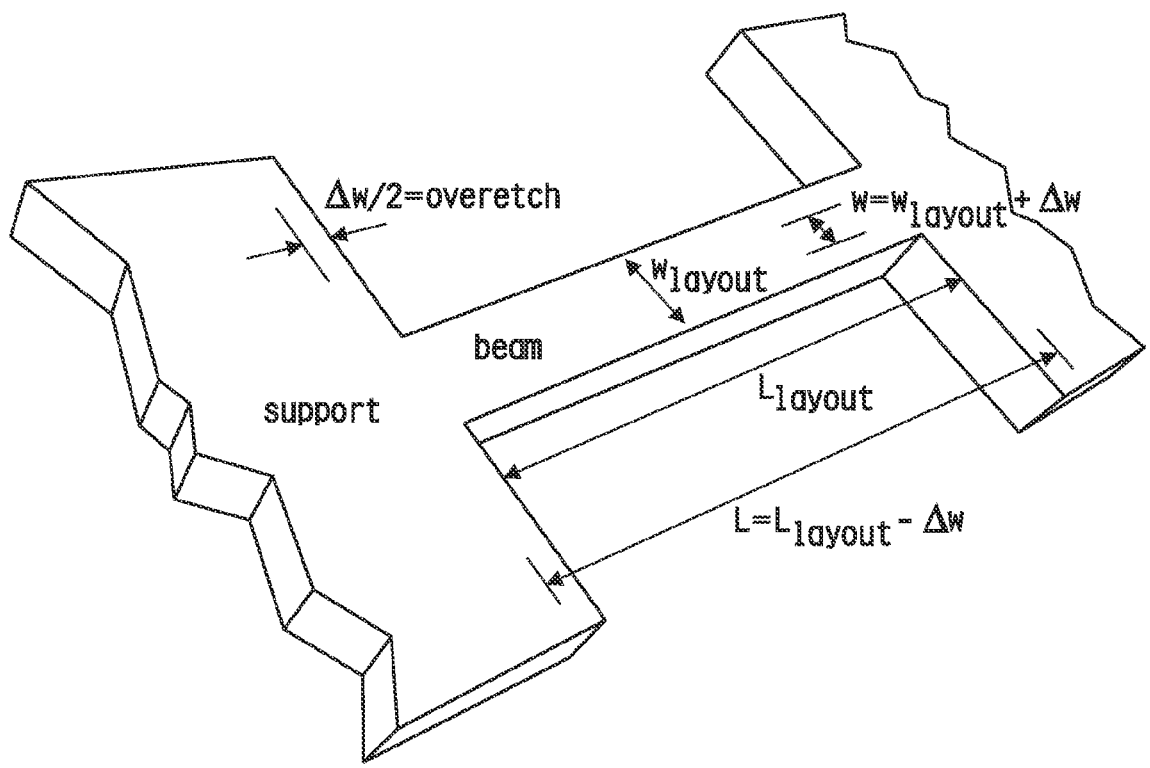
FIG. 6 is a diagrammatical illustration of how the difference between layout geometry and fabrication geometry ($\Delta w$) affects a width, gap, and length of fabricated devices.

An illustration of how uncertainty significantly affects performance is now provided. FIG. 6 illustrates the difference between layout and fabrication of a proportion of a sample device. Δw is the difference between layout and fabrication. Δw affects geometry such as width, gap and length as illustrated in FIG. 6. This differing geometry also affects property such as mass, damping, stiffness, resistance, capacitance, or the like.

The Tang Resonator is one of the most popular micro electro mechanical systems or MEMS. There is about a 2 micro meter gap between the moveable structure and the substrate. The moveable structure is attached to the substrate with two anchors. Electrostatic forces at the comb drive are able to excite the structure to oscillate in the x direction. The stiffness depends on geometrical parameters such as layer thickness h, links of beams L, second moments of areas I and material properties such as Young's modulus E. These properties are not well known. The question is how does an uncertainty in these properties affect performance.

If Δw is defined as the difference between layout and fabrication, then Δw affects geometry such as width, gap and length. Geometry also affects such quantities as mass, damping, stillness, resistance, capacitance, etc.

The stiffness of a Tang Resonator is a convoluted function of lengths and second moments of areas. Second moments of areas have a cubic dependence on width. We add Δw to all of the widths, and we subtract Δw from all the lengths. The stiffness is a function of several unknowns. Given layout parameters and nominal values, we do not know the difference in going from layout to fabrication Δw or, in other words, the error Δw. We also don't know the error in Young's modulus ΔE and we do not know the error in layer thickness Δh.

Figure 7:
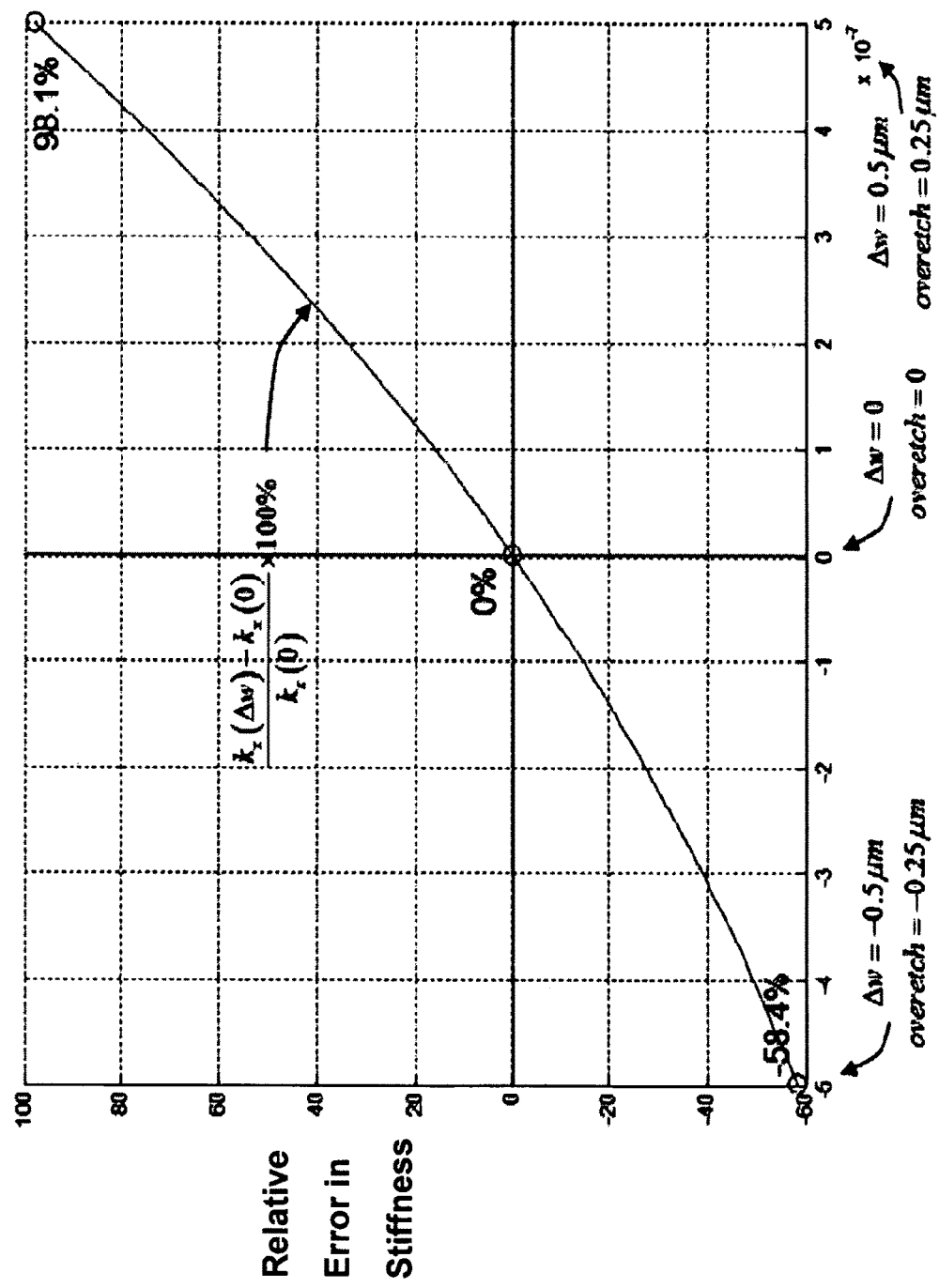
FIG. 7 is a graph illustrating relative error in stiffness of a fabricated device due to $\Delta w$.

Using this stiffness function, a plot the relative error in stiffness as a function of ΔW is shown in FIG. 7. Its quite common to have a 2 micro meter beam over etched by as much as a quarter of a micron. As illustrated in FIG. 7, relative error in stiffness can be as high as 98%. This implies that the fabricated device can have a stiffness that is twice as much as that predicted using layout parameters.

Figure 8:
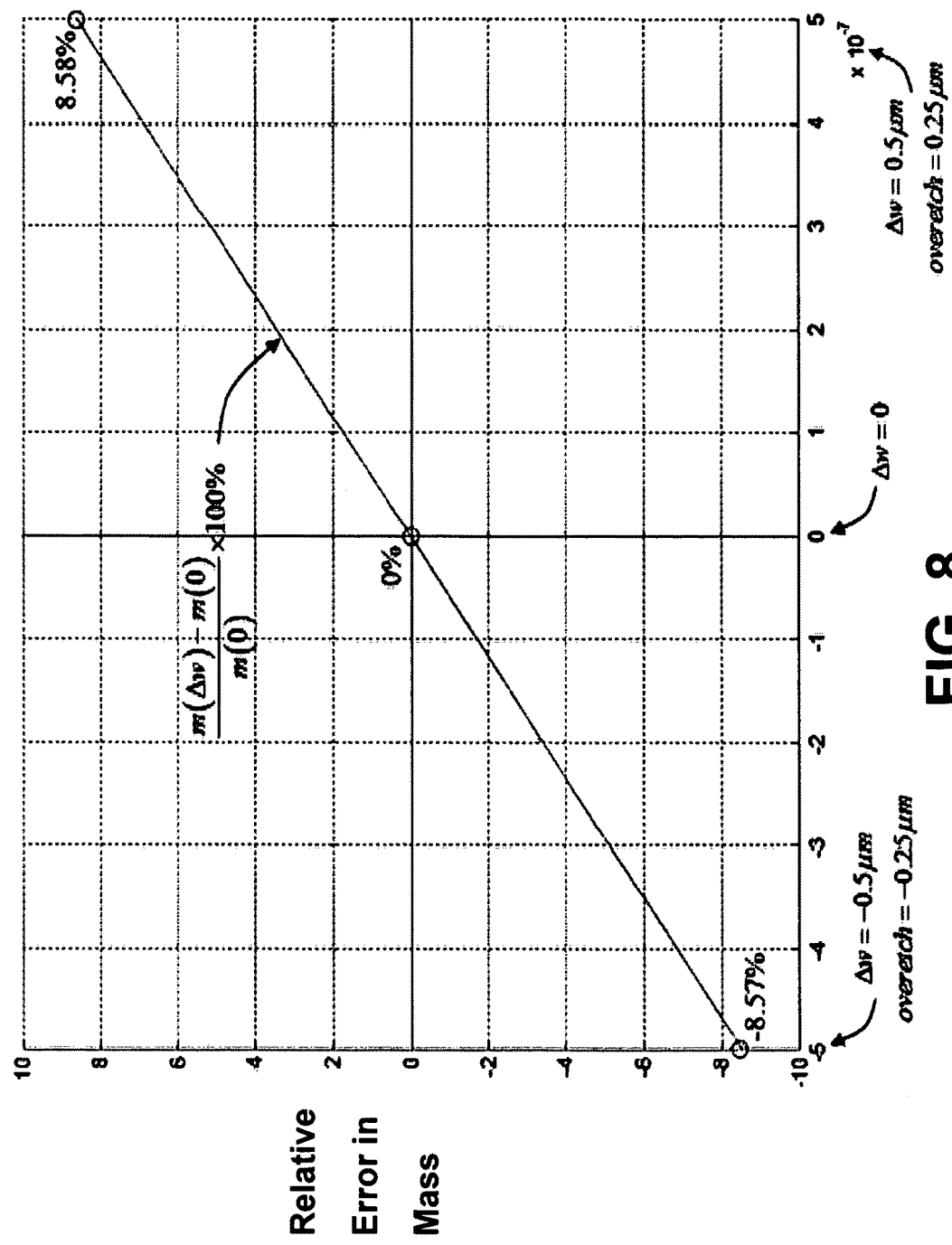
FIG. 8 is a graph illustrating relative error in mass of a fabricated device due to $\Delta w$.

The relative error in mass of a Tang Resonator due to the same range in Δw is shown in FIG. 8. Although mass is not as sensitive to Δw as stiffness, the fabricated device mass can differ from the mass predicted using layout parameters by as much as 8%

Figure 9:
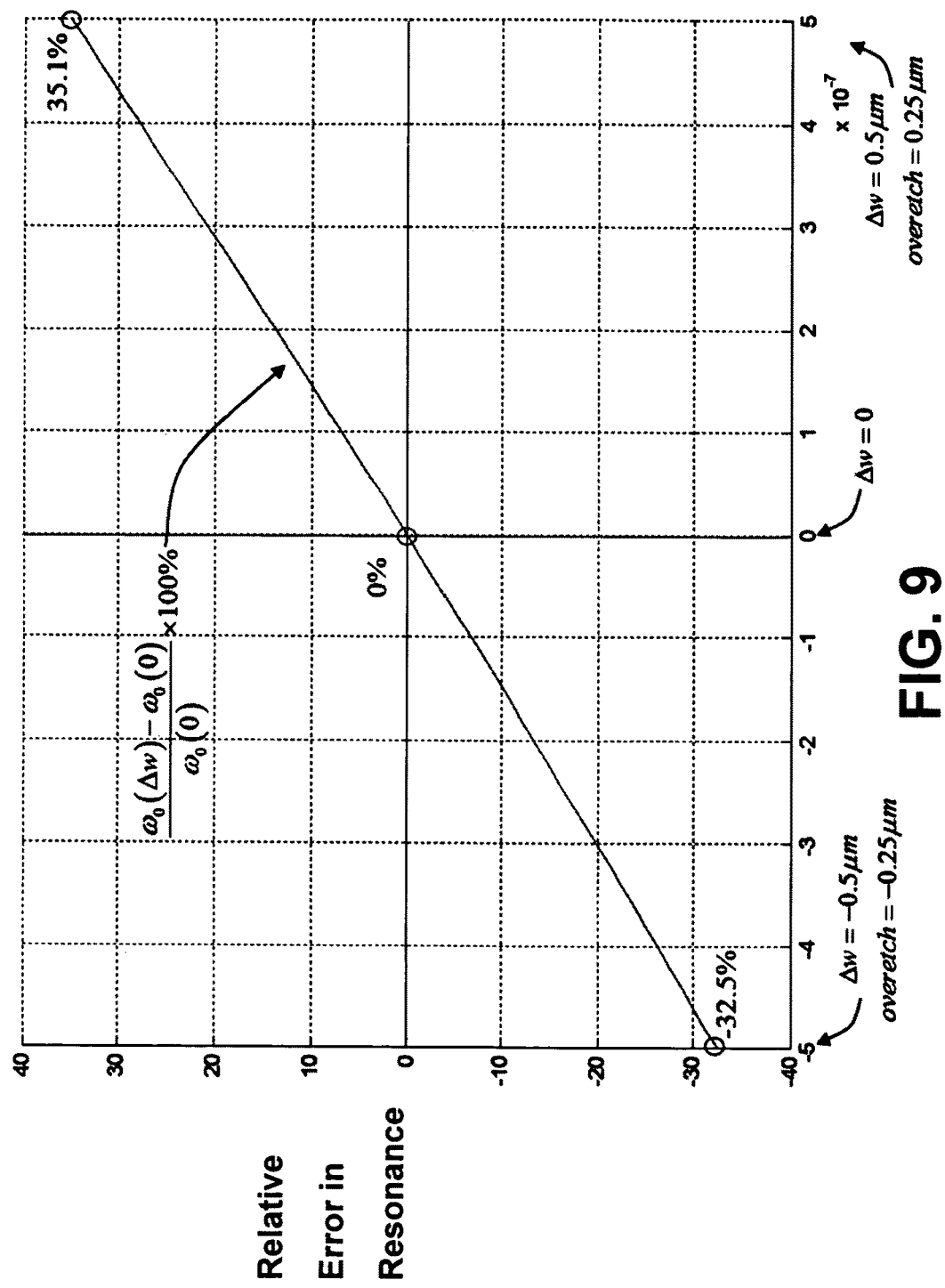
FIG. 9 is a graph illustrating relative error in resonance of a fabricated device due to $\Delta w$.

The relative error in resonance frequency due to Δw is shown in FIG. 9. The resonance frequency of the fabricated device can differ from the resonance frequency predicted using layout parameters by as much as 35%.

Figure 10:
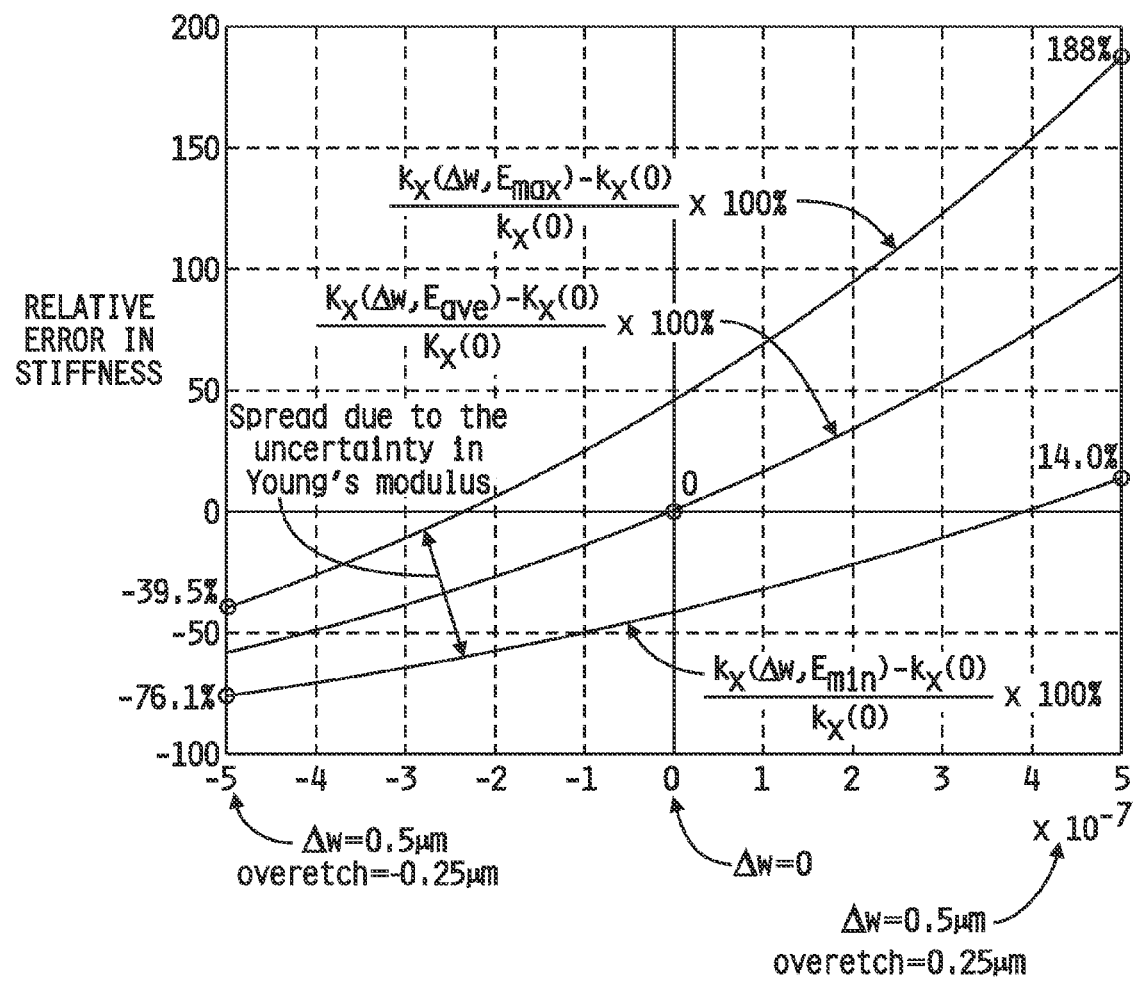
FIG. 10 is a graph illustrating the relative error in stiffness due to both $\Delta w$ and Young's modulus ($\Delta E$)

Recall that ΔW is not the only unknown. Layer thickness h and Young's modulus E are also unknown. Another example is shown in FIG. 10, a plot of the relative error in stiffness is given as a function of over-etch and Young's modulus. For a 2 μm-width cantilever, a 10% error in width implies a 100% change in stiffness. The uncertainty in Young's modulus widens the curve, achieving as much as 188% change in stiffness.

If stiffness is measured and it precisely matches the predicted stiffness, then looking at the 0 horizontal line which intersects the Y band, there is about a 0.6 micrometer range for Δw. Therefore, precisely matching stiffness still leaves geometry and Young's modulus undetermined.

Figure 11:
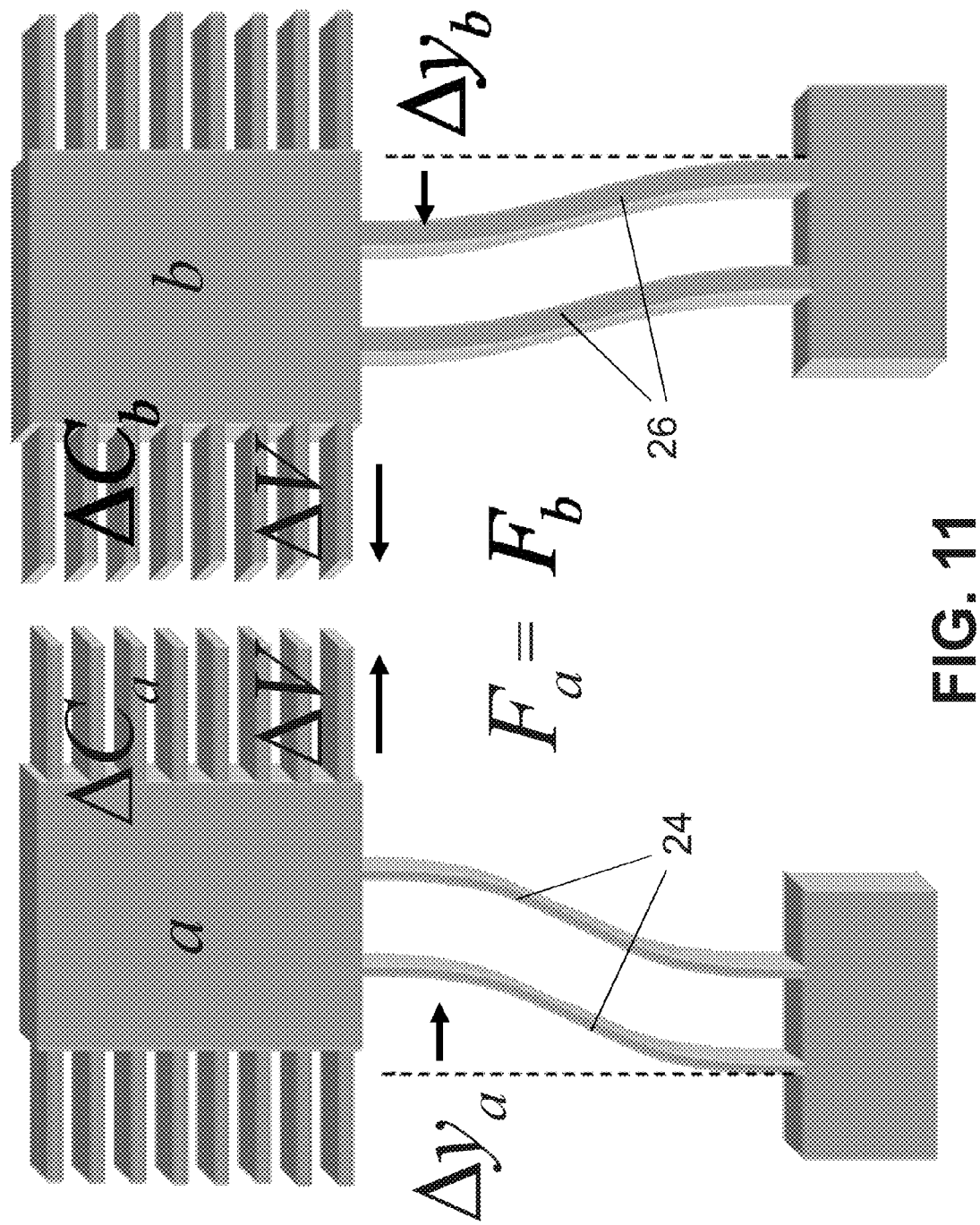
FIG. 11 is a diagrammatically view of two EMM test structures used to derive $\Delta w$ in accordance with the present invention.

The EMM test structure of FIGS. 1-3 may be used to derive ΔW. Illustratively, two such test structures are fabricated side-by-side as shown in FIG. 11, such that they have undergone the same deposition rates, the same concentrations, temperatures and pressures, the same diffusion rates, the same etch rates, the same misalignments. Therefore, these structures have the same errors. When a potential difference is applied at the comb drive to generate a force, the force that is being generated is unknown but since the comb drives are the same, the forces $F_a$ and $F_b$ will be the same as shown in FIG. 11. The widths of the flexures or beams 26 of structure b are slightly larger than the widths of the flexures or beams 24 of structure a; otherwise the two structures are identical. C, k, and y are capacitance, stiffness, and displacement respectively. The two structures are actuated by the same voltage source. Since their comb drives share the same processing errors, they generate the same force (to be determined).

Figure 12:
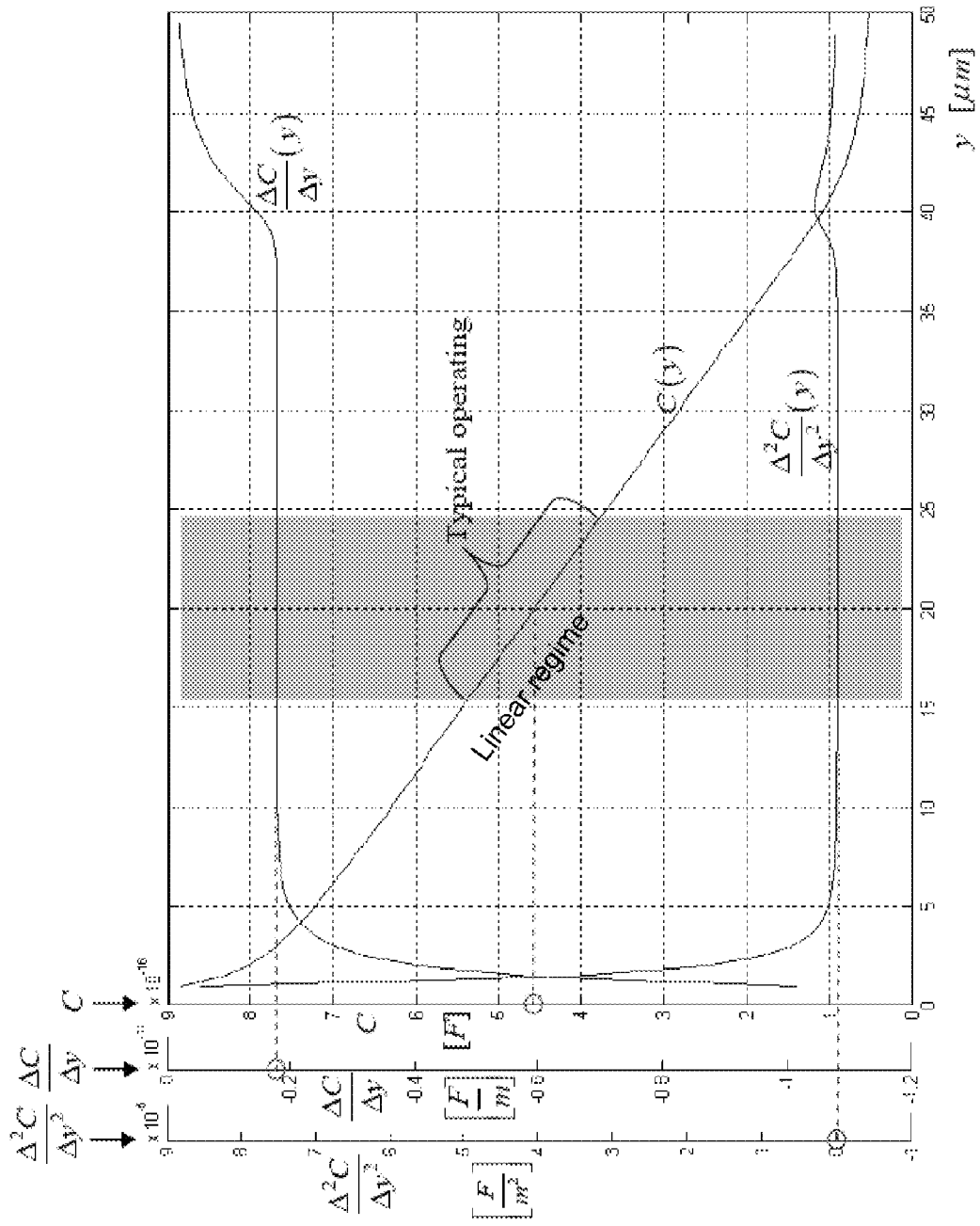
FIG. 12 is a graph illustrating capacitance and its first and second derivatives on the y axis and deflection of a comb drive along the x axis.
Figure 13:
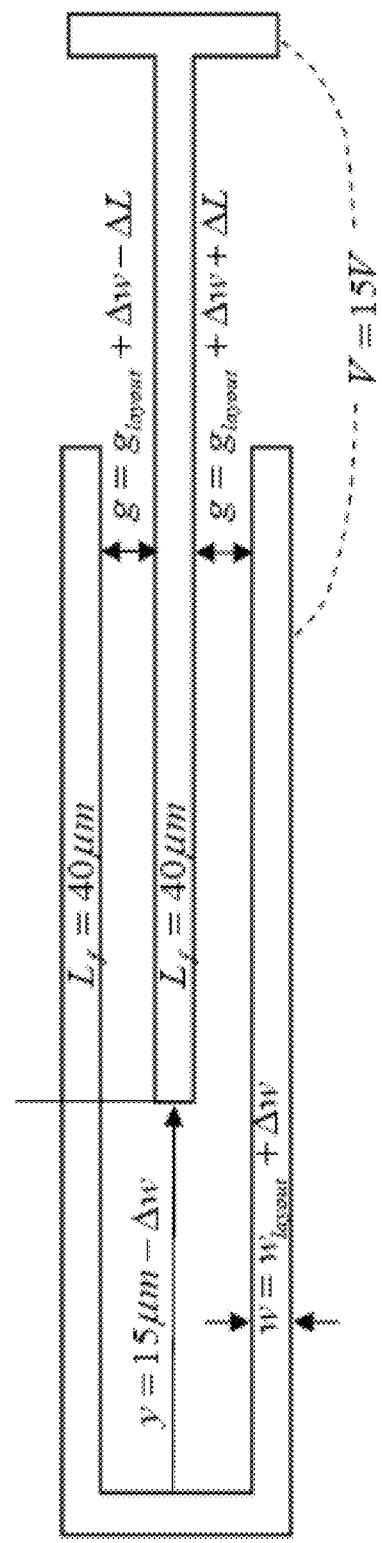
FIG. 13 illustrates details of a single comb finger of the comb drive.

It is worth noting that for a comb drive there is a nice linear regime about its operating point. FIG. 12 is a plot illustrating capacitance and its first and second derivative on the y axis. On the x axis, FIG. 12 shows deflection which corresponds to the single comb finger shown in FIG. 13. Method of moments was used for this data. The comb finger has fringing electric fields along with the equal potentials.

Therefore, when operated within the linear regime of FIG. 12, the partial derivate may be replaced with the differences. That is, partial derivative of capacitance with respect to displacement becomes the change in capacitance divided by the change in displacement as follows:

$$F_a = \frac{1}{2}\Delta V^2 \frac{\Delta C_a}{\Delta y_a}$$

and $$F_b = \frac{1}{2}\Delta V^2 \frac{\Delta C_b}{\Delta y_b}$$

From mechanics, since the forces are equal, the stiffness times are equated to deflection for each structure.

$$F_a = F_b$$
$$\Downarrow$$
$$k_a \Delta y_a = k_b \Delta y_b$$
$$\Downarrow$$
$$\frac{\Delta y_a}{\Delta y_b} = \frac{k_b}{k_a} = \frac{3Ehw_b^3/12L^3}{3Ehw_a^3/12L^3}$$
$$\Downarrow$$
$$\frac{\Delta y_a}{\Delta y_b} = \frac{w_b^3}{w_a^3}$$

On the third equation, we rewrite the second equation in terms of ratios of deflections equaling the ratios of stiffness. Since stiffness is proportional to width cubed, Young's modulus and layer thickness, which is assumed to be equal on both structures, cancel out. Therefore, the ratio of displacements equals the ratio of width cubed as shown above.

Using electrostatics, since the forces are equal, the electrostatic forces are equated. The voltages that were applied are equal. Therefore, the second equation is rewritten in terms of a ratio of displacements equaling a ratio of change of measured capacitance.

$$F_a = F_b$$
$$\Downarrow$$
$$\frac{1}{2}\Delta V^2 \frac{\Delta C_a}{\Delta y_a} = \frac{1}{2}\Delta V^2 \frac{\Delta C_b}{\Delta y_b}$$

-continued
$$\Downarrow$$
$$\frac{\Delta y_a}{\Delta y_b} = \frac{\Delta C_a}{\Delta C_b}$$

The results of mechanics are coupled with electrostatics by equating the ratio of displacements. That is, the ratio of displacements is equal to the ratio of change of capacitances and that's equal to the ratio of widths cubed. The fabricated widths are equal to a layout width plus $\Delta W$.

$$\frac{\Delta y_a}{\Delta y_b} = \frac{\Delta C_a}{\Delta C_b} = \frac{w_b^3}{w_a^3}$$
$$w_b = nw_{a,layout} + \Delta w$$
$$w_a = w_{a,layout} + \Delta w$$

Since the layout width is known and since capacitance can be measured, the only unknown left is $\Delta W$ which is the difference between layout and fabrication. Solving for $\Delta W$, we obtain the following expression:

$$\Delta w = \left( \frac{n\left(\frac{\Delta C_b}{\Delta C_a}\right)^{1/3} - 1}{\left(\frac{\Delta C_b}{\Delta C_a}\right)^{1/3} - 1} \right) w_{a,layout}$$

Figure 14:
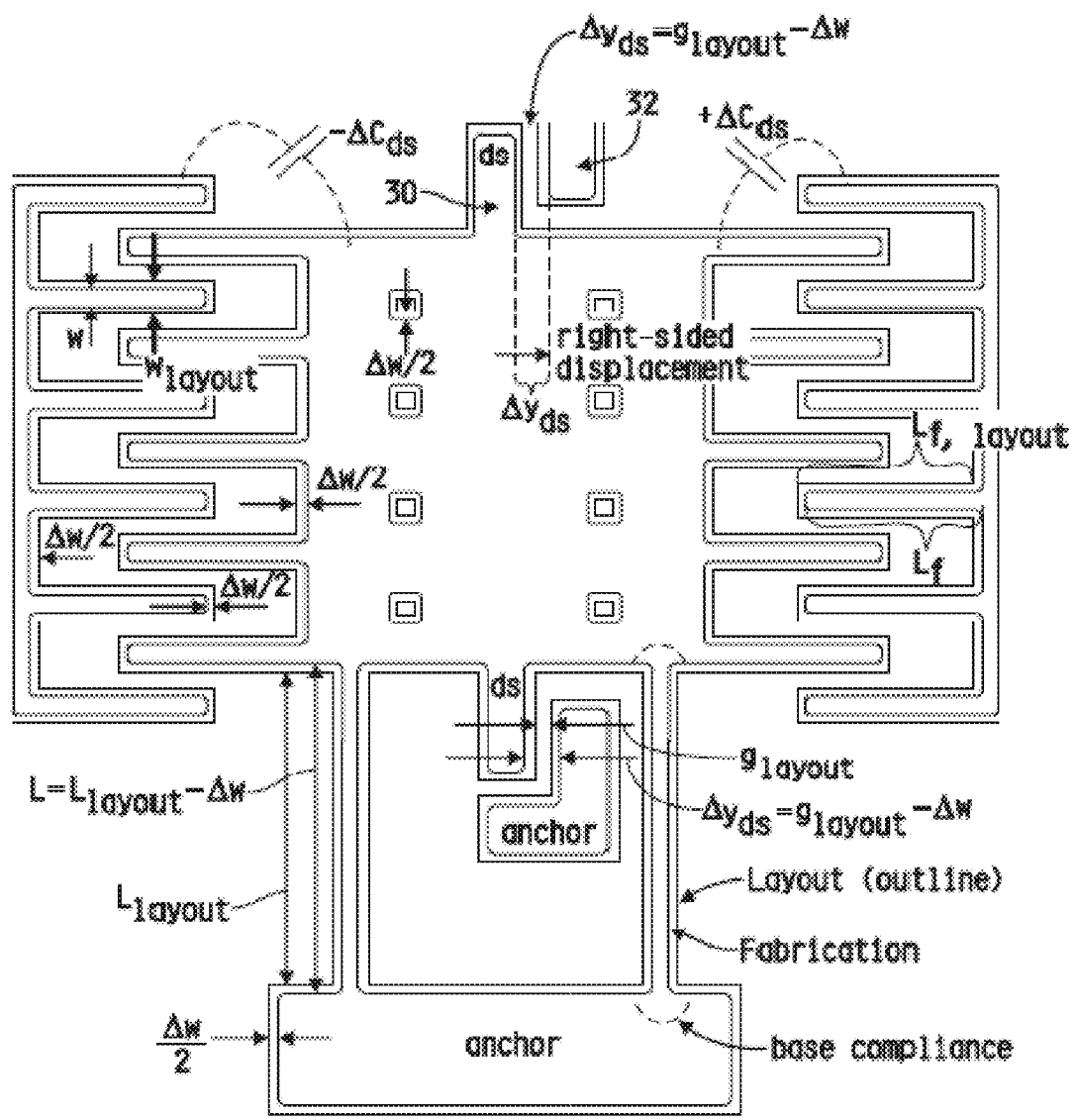
FIG. 14 illustrates that all the dimensions of the comb drive can be determined once $\Delta w$ is determined.

Therefore, $\Delta w$ is expressed in terms of exactly known layout parameters and precisely measured change of capacitances. Since $\Delta W$ is accurately obtained using the formula above, all planar geometries become available at once. All the widths, all the gaps, all the lengths, etc. of the fabricated device are then known as illustrated in FIG. 14 and shown below.

$$w = w_{layout} + \Delta w;$$
$$g = g_{layout} - \Delta w;$$
$$L = L_{layout} - \Delta w;$$
$$L_f = L_{f,layout};$$
$$A_{plate} = (L_{1,layout} + \Delta w)L_{2,layout} + \Delta w)$$
$$-N_H(H_{layout} - \Delta w)^2;$$
$$A_{comb} = N_f L_{f,layout}(w_{layout} + \Delta w);$$
$$A_{kbeam} = (L_{layout} \Delta w)(w_{layout} + \Delta w);$$
$$R = R_{layout} + \Delta w/2;$$

etc.

Every time total capacitance is measured with a probe tip, the parasitic capacitance changes. That is, every experiment has a different total capacitance. However, measuring the change in capacitance allows us to achieve repeatability. That is, the parasitic capacitances cancel in the difference and what is left over is a difference in capacitance and uncertainty which adds in quadrature.

Next, it is determined how uncertainty in capacitance affects $\Delta W$. The following expression is used for $\Delta w$ with capacitance added in.

$$\Delta w(\delta C) = \left( \frac{n\left(\frac{\Delta C_b + \sqrt{2}\,\delta C}{\Delta C_a + \sqrt{2}\,\delta C}\right)^{1/3} - 1}{\left(\frac{\Delta C_b + \sqrt{2}\,\delta C}{\Delta C_a + \sqrt{2}\,\delta C}\right)^{1/3} - 1} \right) w_{a,layout}$$

Using sensitivity analysis, it is determined how uncertainty in geometry depends on uncertainty in capacitance. Using the last expression for $\Delta W$ above, let's expand it using a Taylor series about the uncertainty capacitance $\delta C$. The third equation shows that everything is in terms of exactly known layout parameters and precisely measured capacitance. The second term in the third equation is the uncertainty in geometry. The bracket expression is the sensitivity and it is multiplied by the uncertainty in capacitance. The sensitivity may be quite large. Therefore, it is important that the uncertainty be very small such that the uncertainty in geometry is small.

$$\Delta w(\delta C) = \Delta w \pm \left[\frac{\partial w}{\partial \delta C}\right] \delta C$$
$$= \Delta w \pm \delta w$$

uncertainty in geometry $$= \left( \frac{n\left(\frac{\Delta C_b}{\Delta C_a}\right)^{1/3} - 1}{\left(\frac{\Delta C_b}{\Delta C_a}\right)^{1/3} - 1} \right) w_{a,layout} \pm \left[ \frac{\left(\frac{\Delta C_b}{\Delta C_a}\right)^{1/3}(\Delta C_a - \Delta C_b)}{\frac{(1-n)w_{a,layout}}{3\Delta C_a \Delta C_b}} \right] \delta C$$

Some numbers may be plugged into this equation to determine the expected uncertainty. The parameters we will use are an over-etch of 0.2 microns, a beam width of 2 microns, a beam length of 1000 microns, a beam thickness of 2 microns, layout parameter n=2, lap, number of comb fingers 50, Young's modulus 170 GPa, gap spacing 2 microns, comb-finger overlap 20 microns, applied voltage of 50 volts. This implies that the change in capacitance on test structure a is:

$\Delta C_a = 5.41 \times 10^{-13} F$

For test structure b, the change in capacitance is:

$\Delta C_b = 7.78 \times 10^{-14} F$

The sensitivity is quite large as follows:

$$\left[\frac{\partial w}{\partial \delta C}\right] = 1.88 \times 10^8 \frac{m}{F}$$

Recall that the uncertainty in geometry is equal to a very large sensitivity times a very small uncertainty in capacitance. If an Attofarad capacitive resolution, such as found in an ADI chip or an Agilent LCR meter, is used, then $\delta C = O(10^{-18})$ What results is a $\Delta W$ of 0.2 microns±about 2 angstroms as shown below. This uncertainty in geometry is about the size of a silicon atom.

$$\Delta w(\delta C) = \Delta w \pm \left[\frac{\partial w}{\partial \delta C}\right] \delta C$$
$$= 0.2 \times 10^{-6} \pm [1.88 \times 10^8] \times 10^{-18}$$
$$= 0.2 \times 10^{-6} \pm 1.88 \times 10^{-10}$$

If the Attofarad uncertainty in capacitance is replaced with Zeptofarad capacitive resolution so that:

$\delta C = O(10^{-21})$

Zeptofarad capacitance resolution has been reported by the Thomson group at the University of Manitoba using off chip electronics. ADI has also reported Zeptofarad capacitance resolution using their ADXRS-150 gyros. What results is a $\Delta W$ of 0.2 microns±a geometric uncertainty of about 200 femtometers as follows:

$$\Delta w(\delta C) = \Delta w \pm \left[\frac{\partial w}{\partial \delta C}\right] \delta C$$
$$= 0.2 \times 10^{-6} \pm [1.88 \times 10^8] \times 10^{-21}$$
$$= 0.2 \times 10^{-6} \pm 1.88 \times 10^{-13}$$

After measuring geometry, we now measure force and displacement. One way to calibrate force is by using displacement stops. Since we know a geometry, we know the gaps between structures. Using displacement stops such as stops 30 and 32 shown in FIG. 14, a voltage is applied on the comb drive which deflects it to the right. Once stop 30 contacts the displacement stop 32, the change in capacitance is measured.

As long as operation occurs within the linear regime of the comb drive shown in FIG. 12, the ratio of changed capacitance to displacement is a constant. Since we just measured $\Delta C_{ds}$ and $\Delta y_{ds}$, let's call that ratio the comb drive constant upsilon.

$$F = \frac{1}{2}\frac{\partial C}{\partial y}\Delta V^2$$
$$= \frac{1}{2}\left[\frac{\Delta C_{ds}}{\Delta y_{ds}}\right]\Delta V^2$$
$$= \frac{1}{2}\Upsilon \Delta V^2$$

Where $\Upsilon = \frac{\Delta C_{ds}}{\Delta y_{ds}}$ is the comb drive constant.

The sensitivity analysis of force requires a multivariable Taylor expansion because now these are uncertainties in capacitance and voltage.

$$F(e + \delta e) = F(e) + \sum_{i=1}^{4} G_i(e)\delta e_i + \sum_{i=1}^{4}\sum_{j=1}^{4} \delta e_i H_{ij}(e) \delta e_j + \ldots$$

$$e = \begin{pmatrix} \Delta C_{ds} \\ \Delta C_a \\ \Delta C_b \\ \Delta V \end{pmatrix}, \delta e = \begin{pmatrix} \delta C_{ds} \\ \delta C_a \\ \delta C_b \\ \delta V \end{pmatrix}, G_i(e) = \frac{\partial F}{\partial e_i}, H_{ij}(e) = \frac{\partial^2 F}{\partial e_i \partial e_j}.$$

The uncertainty in force involves several terms. Each term is a product of sensitivity multiplied by a very small uncertainty in an electrical measurand e $$F(e + \delta e) = F(e) + \delta F(e, \delta e)$$

$$\delta F = |G|^T |\delta e|$$

$$= \left|\frac{\partial F}{\partial \Delta C_{ds}}\right||\delta C_{ds}| + \left|\frac{\partial F}{\partial \Delta C_a}\right||\delta C_a| + \left|\frac{\partial F}{\partial \Delta C_b}\right||\delta C_b| + \left|\frac{\partial F}{\partial \Delta V}\right||\delta V|$$

Applying the same parameters used above for geometry, the following is expected for force. Using a capacitive resolution on the order of attofarad, a resolution in force on the order of piconewtons is expected as shown below. With a zeptofarad resolution, an uncertainty in force on the order of tenths of femtonewtons is expected as also shown below.

$$\delta C = O \text{ (attofarad)}$$
$$\delta C = O \text{ (zeptofarad)}$$
$$\delta F = 2.40 \times 10^{-12} \text{ N}$$
$$\delta F = 2.61 \times 10^{-16} \text{ N}$$
$$F = 1.01 \times 10^{-8} \text{ N}$$
$$F = 1.01 \times^{-8} \text{ N}$$
$$\frac{\delta F}{F} = 2.39 \times 10^{-4}$$
$$\frac{\delta F}{F} = 2.59 \times 10^{-8}$$

As discussed above, the use of EMM improves the force levels capable of being detected compared to a mass balance on an atomic force microscope.

Measuring displacement can be achieved by equating the comb drive constant upsilon to any ratio of capacitance and displacement within the linear regime. Displacement is equal to the measurement of change of capacitance divided by upsilon. Expectations using zeptofarad capacitive resolution yields uncertainty and displacement on the order of 100 fm.

Sensitivity analysis shows that the performance of EMM is a strong function of geometrical design parameters. Error analysis shows that the precision of EMM is a function of capacitance resolution. Currently, the most precise capacitance measurements on a microchip are on the order of zeptofarads. Hence, depending on geometry and capacitance resolution, analytical, simulation, and error analysis show that measurements as precise as sub-piconewton forces and sub-picometer displacements are obtainable. Such well-calibrated devices lead to precise sensors and actuators as described herein.

Figure 15:
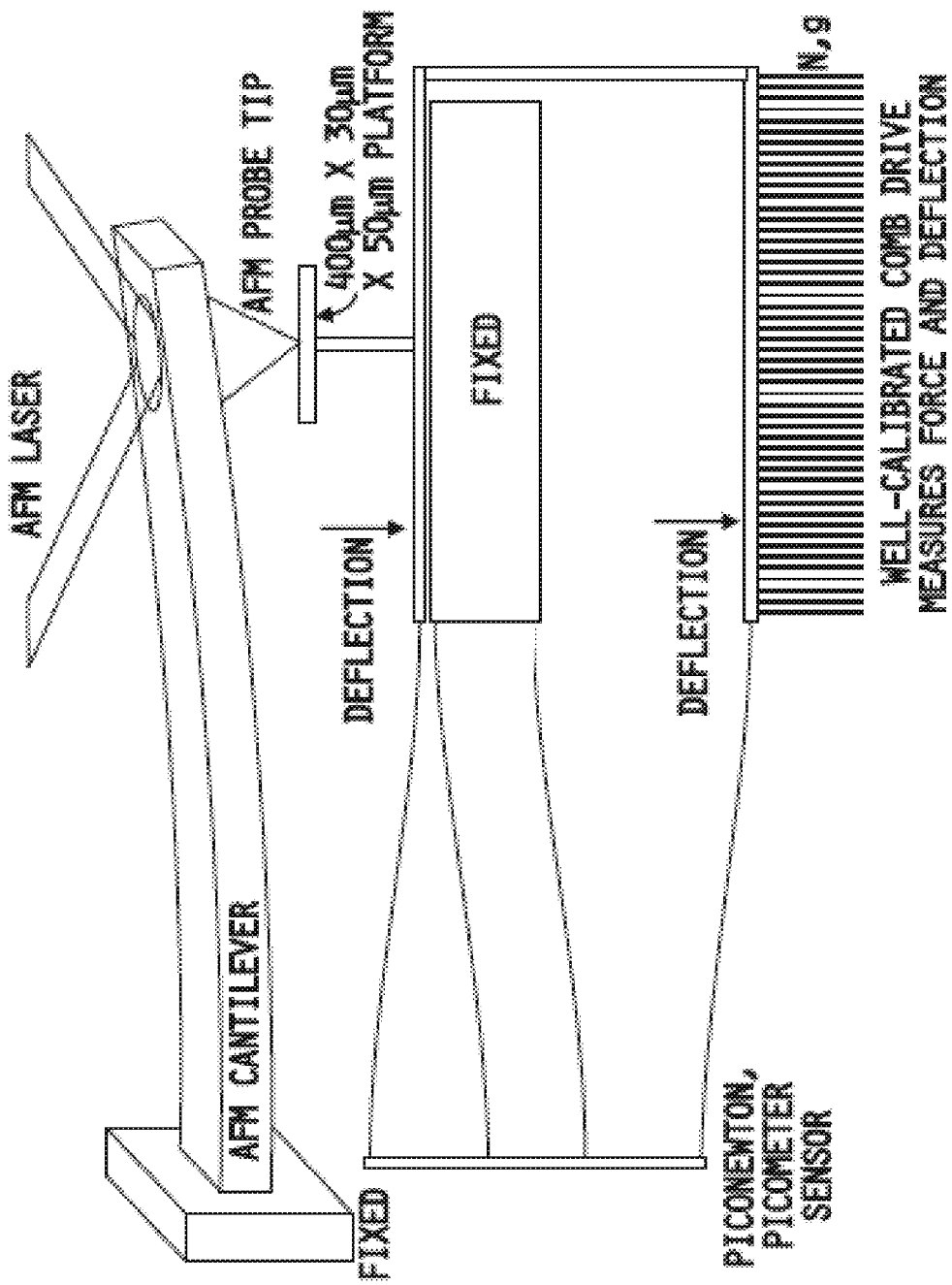
FIG. 15 is an illustrative embodiment of the present invention in which a well calibrated force displacement gauge of the present invention is used to calibrate the bending stiffness of an atomic force microscope cantilever.
Figure 16:
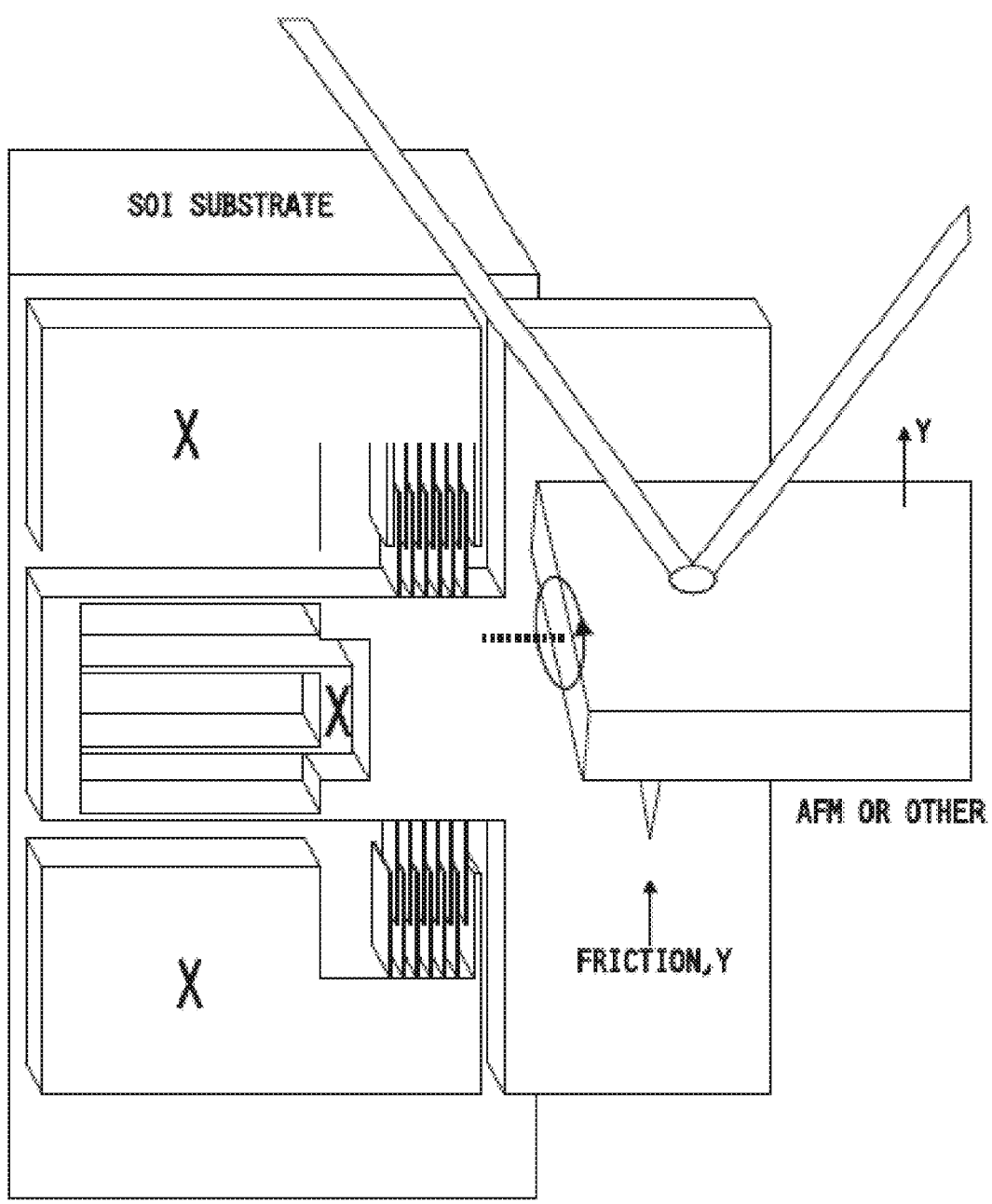
FIG. 16 is a diagrammatical view in which a well calibrated force sensor of the present invention is used to calibrate torsional stiffness of an AFM cantilever or to measure friction by sliding the AFM probe tip across the surface of the force sensor.
Figure 17:
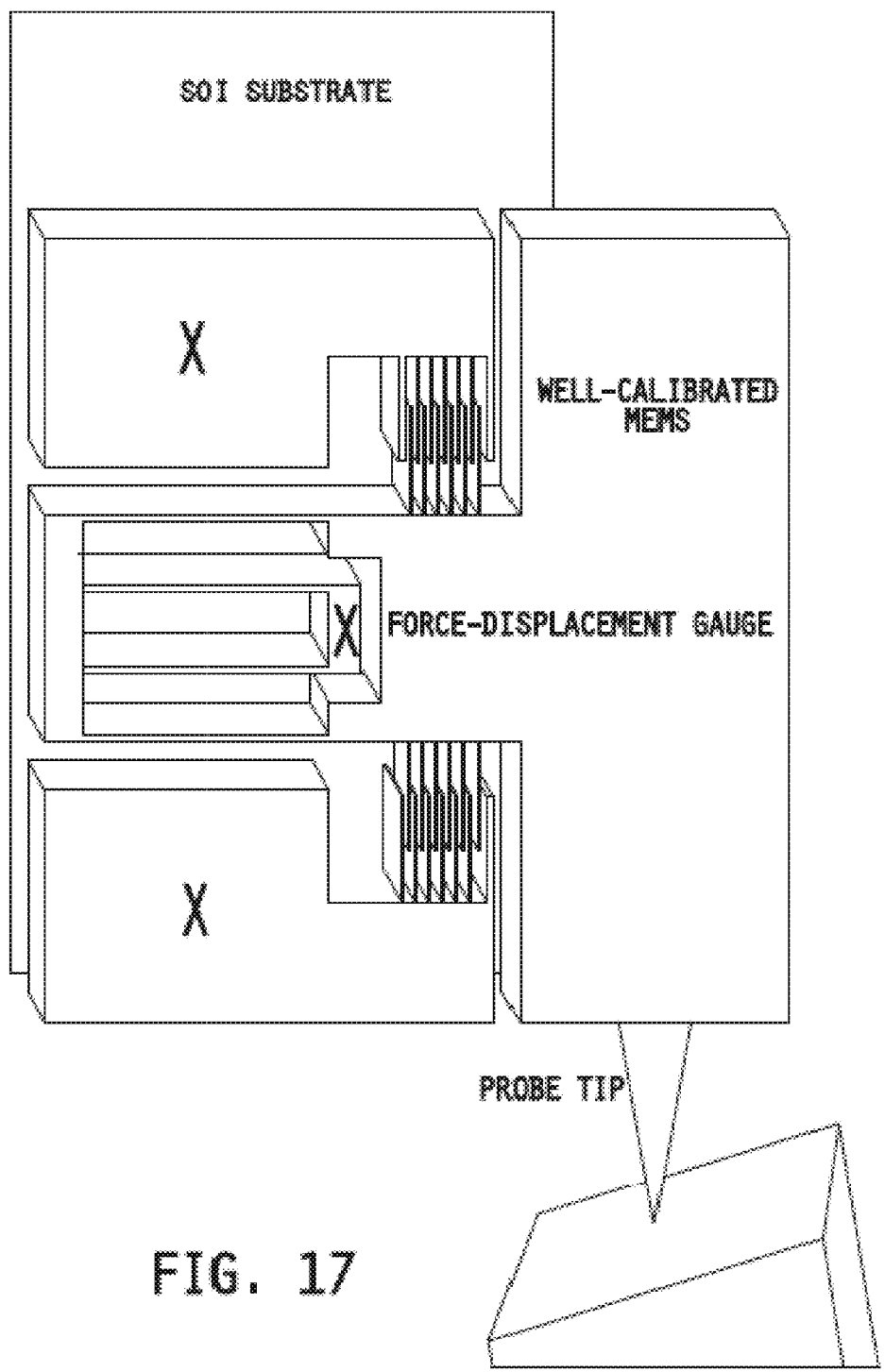
FIG. 17 is a diagrammatical view of another embodiment of the present invention in which an AFM probe tip is coupled directly to the well calibrated force displacement gauge of the present invention to produce an AFM several orders of magnitude more precise than a conventional AFM.

FIGS. 15-17 illustrate three applications of the EMM calibration system and method of the present invention. The first application shown in FIG. 15 is a device used to calibrate the bending stiffness of an AFM cantilever. This particular EMM device is fabricated using the SOI process. The thickness of this process is used as a surface for which to apply displacements and loads. Any displacement or load applied by the AFM can be sensed by a well calibrated EMM device.

Applications of the apparatus and method of the present invention are numerous. As an example, the present apparatus and method improves the precision of nanoscale force-deflection measurements.

AFM Cantilever Calibrator:

The conventional AFM is the industry standard device for nanotechnologists. The EMM device may be used by nanotechnologists to calibrate their AFMs, as illustrated in FIG. 15. Currently, AFM cantilevers are calibrated by the thermal method, added weight method, or geometrical method. Such methods are typically in error of 1 to 15% error as discussed above. In FIG. 15, a well-calibrated microdevice is used as a force-displacement gauge to calibrate an AFM in the bending mode. That is, since the geometric and material properties of the microdevice have been precisely determined, it becomes a well-calibrated sensor, able to characterize externally applied forces and displacement. The high precision of the EMM device offers a traceable method of calibration for both force and displacement.

A second AFM calibration application illustrated in FIG. 16 is a calibration of the torsional stiffness of an AFM cantilever. This embodiment may also be used to measure friction. This can be done by sliding the AFM probe tip across the surface of an EMM device.

This illustrated apparatus and method may be extended by attaching an AFM probe tip directly onto a well-calibrated microdevice, i.e. an AFM-on-a-chip, as depicted in FIG. 17. In doing so, we should achieve measurements of forces and displacements that are several orders of magnitude more precise than conventional AFMs. Although the conventional AFM cantilevers are microscale structures, they are not readily amenable to EMM technology.

DNA Sequencer:

FIG. 17 also illustrates a version of the present device used as a single-strand DNA sequencer. That is, the end of one strand of DNA is immobilized onto the EMM device, and the end of its adjoining strand is immobilized onto the substrate. The EMM device measures the forces required to separate the 10 piconewton AT bonds and the 15 piconewton GC bonds. By recording the required applied forces, the device has effectively sequenced the single DNA molecule.

Figure 18:
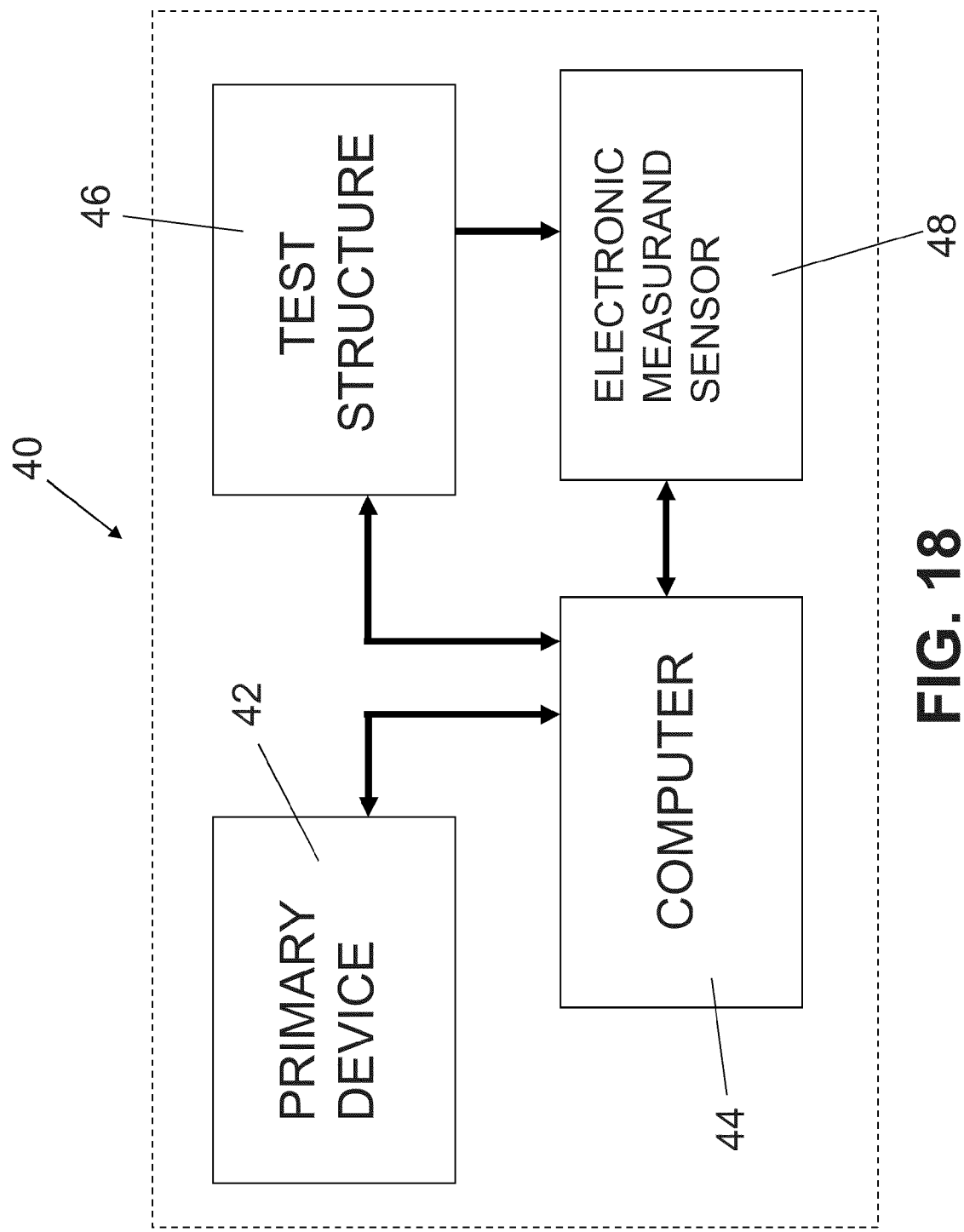
FIG. 18 is a block diagram illustrating components of an embodiment of the present invention in which a calibration device is integrated on the same chip with a primary devices to calibrate the primary devices and improve operation thereof.

Self-Calibrating Chips:

EMM may also be used to create microchips that are able to self-calibrate. One such configuration is illustrated in FIG. 18. Self calibration is useful for devices where precision is necessary in spite of harsh environmental change or long-term dormancy. Microsystems will be able to self-calibrate by fabricating EMM devices alongside the primary microsensor/actuators such that both the EMM device and primary device share the same material properties and geometrical errors to do process variations. Since the EMM device functions as a device which can determine its own properties, by doing so it has effectively determined the shared properties of its neighboring devices. This ability is especially important for distributed sensors which may lie dormant for years; or for micro sensors and actuators onboard space probe missions where drastic temperature and atmospheric changes may affect material properties or performance; or for missile defense where sensors must constantly recalibration as conditions change going from dormancy at desert temperatures, to 1000 miles per hour velocities, to exoatmospheric conditions. In addition, instead of short-circuiting as conventional sensors do, EMM is also able to re-calibrate when exposed to aqueous environments.

Combining on-chip electrical circuits along with test structures allow packaged devices to measure their properties and recalibrate as conditions change. The subsystems of such an integrated MEMS/NEMS device are illustrated in FIG. 18. The device 40 includes a primary device 42 which may be any desired micro or nano-scale scale device which may be improved using the calibration techniques described herein.

Non-limiting examples of such primary devices 42 include the atomic force microscope, gravimeter, AFM cantilever calibration device, single strand DNA sequencer, nanomanipulator, quality control for batch fabrication foundries, self-calibrating chips, altimeter, strain sensor, Casimir force sensor, or a biological force-displacement probe. In addition, primary device 42 may be a switch, tunable capacitor, tunable inductor, gyro, pressure sensor, resonator, or the like.

The primary device 42 is controlled by a computer 44 which may be on the same chip 43 or separate from the chip 43 of the primary device 42. Computer 44 may be any type of computer, processor or controller. The calibration device includes a test structure 46 on the same chip 43 with the primary device 42. In other embodiments, the test structure 46 may be separate from the chip 43 of the primary device 42. The test structure 46 may provide on-chip measurement of unknown variables likely to occur during fabrication as discussed herein. Illustratively, test structure 46 permits on-chip measurement of Young's modulus, density, stress, stain gradient, geometry, viscosity, stiffness, or the like. As discussed herein, EMM techniques are used to extract mechanical properties of the test structure 46 as functions of electronic measurands. These properties may be geometric, dynamic, material or other properties. Therefore, an electronic measurand sensor 48 is provided to measure the desired electrical measurand on the test structure 46. For instance, electronic measurand sensor 48 may measure capacitance, voltage, frequency, or the like. The electronic measurand sensor 48 may be on the same chip 43 with the test structure 46. In other embodiments, electronic measurand sensor 48 may be separate from the chip 43 of the test structure 46.

Computer 44 receives the output from electronic measurand sensor 48 and calculates the mechanical properties of the test structure 46 as functions of measured electronic measurands. For example, sensed capacitance may be used to calculate Δw as described in detail herein. If the primary device 42 is on the same chip 43 as the test structure 46, then it can be assumed the at same mechanical properties of the test structure 46 may apply to the primary device 42. This is because the primary device 42 and the test structure 46 have undergone the same deposition rates, the same concentrations, temperatures and pressures, the same diffusion rates, the same etch rates, the same misalignments on the chip 43. Therefore, the computer 44 can use the calibration information from the test structure 46 and sensor 48 to control and/or improve the precision of the primary device 42.

Since EMM is performance-based, which matters most to industry developers and consumer, this technology may lead to much-needed micro/nanoscale standardization for accelerated technological advancement and improved international commerce.

The present invention overcomes problems associated with conventional oscillator and AFM designs (and other microfabricated devices) which are not well-calibrated. For example, conventional oscillator and AFM designs do not offer ways to determine its Young's modulus or stiffness, mass or material density, planar geometry, and layer thickness. Because of these problems, conventional micro-fabricated devices have a large amount of uncertainty, illustratively a 1% to about 20% error.

The apparatus and method of the present invention uses designs based on EMM, as described herein, which are well-calibrated. This makes the apparatus and method of the present invention several orders more precise than conventional devices.

Other applications of the EMM techniques described herein include:

Fundamental Forces:
By not attaching a probe tip, the Casimir force can be measured between the closing gap of two plates that are at the same potential.

Altimetry:
Due to EMM's ability to measure piconewton force, the device can be used to measure distance from the surface of the earth. An illustration of measuring height above earth is the following equation:

$$dF = GMm\left(\frac{1}{R^2} - \frac{1}{(R+h)^2}\right)$$

where:
M is the mass of the earth, $5.974 \times 10^{24}$ kg
R is the radius of the earth, 3671 km
m is the effective proof mass, e.g. $5 \times 10^{-8}$ kg
h is the height of the device above the earth surface
G is the gravitational constant=$6.67 \times 10^{-11}$ m$^3$ kg$^{-1}$ s$^{-2}$
dF is the change in force. Minimum is the force resolution.

For example, if the sensor is to detect a change in height of 1 meter, then the force resolution should be 1 piconewton.

Conventional altimeters use pressure to determine altitude, which wildly fluctuates. An EMM-based altimeter does not require pressure, so the device can be enclosed in a package. It can also be used with GPS to allow for the out-of-plane dimension of position.

Gravimetry:
The EMM device's ability to measure the gravitational force allows it to be used as a gravimeter on a chip. Conventional gravimeters are very expensive, large, and not easily portable. Gravimeters are often used to discover oil deposits and other large underground deposits. In another embodiment, the gravimeter/altimeter device is sensitive enough to measure gravity difference of a few feet—such as moving between floors within a building.

Nanomanipulator:
The present device may also be used as a nanomanipulator. Current nanomanipulators cost tens of thousands of dollars, and they are not as precise as the present device, and they do not allow its user to measure force. However, incorporating both precise force and displacement sensing and actuation abilities in a nanomanipulator facilitates haptic force-feedback for the user. Such nanomanipulation will open the door to nanoscale assembly.

In-Situ Fabrication Metrology:
In-situ fabrication metrology requires an EMM device to provide measurement data during fabrication. In this set up, an EMM property diagnostic chip experiences high temperatures while self-calibrating, and measuring the properties of deposited layers. In this way, process parameters such as temperature, pressure, concentration and reactants may be monitored by a computer/controller and then modified during processing to maximize quality control.

Strain Sensor:
Due to EMM's ability to self-calibrate, changes in strain due to stress from thermal expansion or fatigue may be detected by sensing a change in comb drive deflection. Changes on the order of 100 femtometers have been detected in comb drives. EMM is able to precisely quantify such changes. Applications include monitoring the lifecycle of aircraft, buildings, dams, bridges, high-pressure containers, etc.

Figure 19:
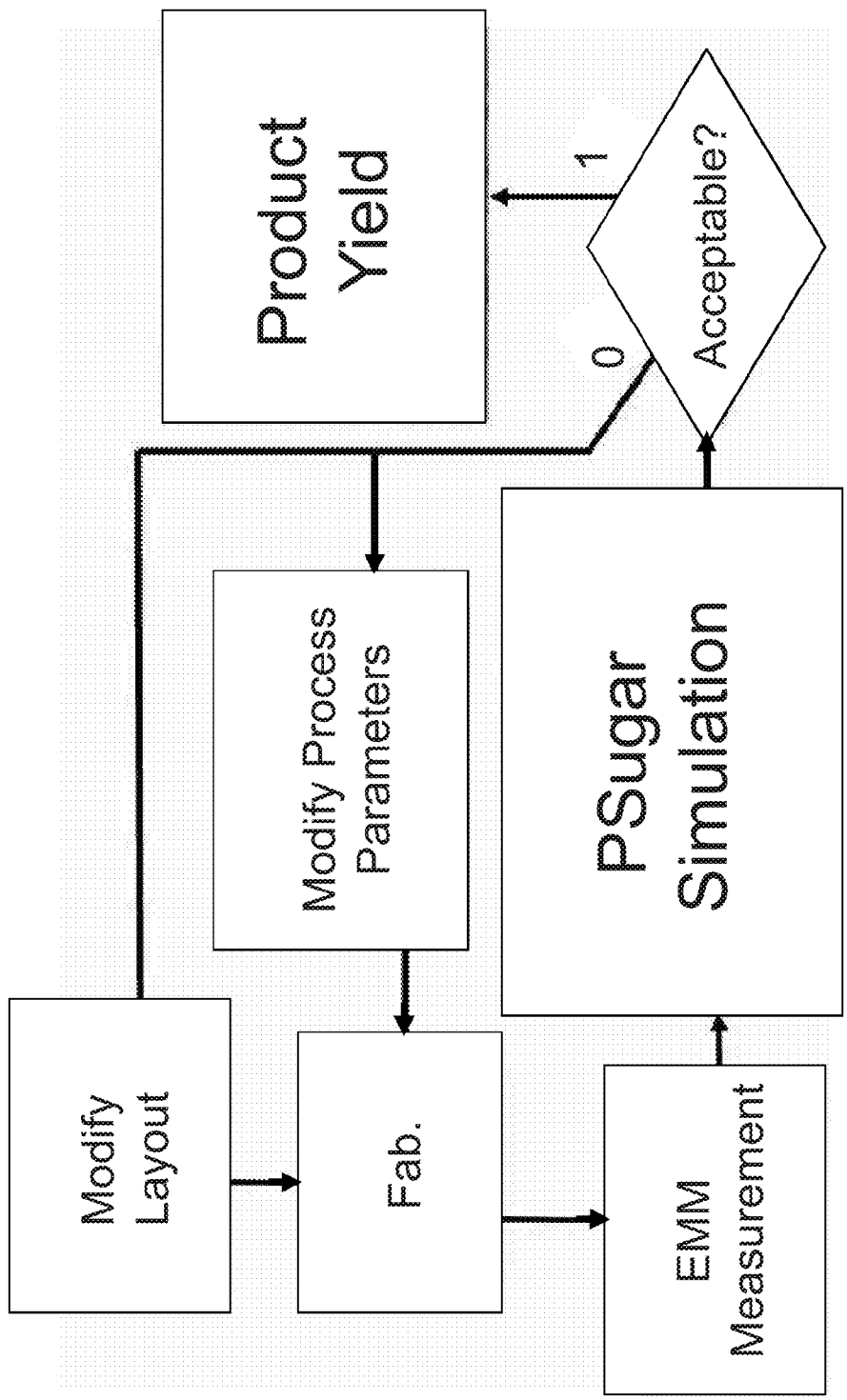
FIG. 19 is a block diagram illustrating a general process flow of an automatable fabrication process.

Quality Control for Batch Fabrication:

EMM may also used to increase the yield of batch fabrication. FIG. 19 illustrates a general process flow of an automatable fabrication process. For an automated example, upon fabrication a robotic may electronically probe the newly fabricated wafer for EMM properties. Such properties will be used as input to modeling parameters for experimentally-accurate simulation, which is used to test the performance. If the test is not passed, then the process flow may proceed to either modifying material properties such as temperature, concentration, and pressure, or modifying the geometrical layout for a subsequent run. In doing so, the yield is increased.

Data Storage:

The present device shown in FIGS. 20-23 discussed below, or other suitable EMM design, may also be used as a data storage device. That is, by operating over a deformable polymer surface, the device will be able to precisely position itself and create data bits in the form of dimples in the polymer. The size of the dimple will depend on the radius of the probe tip. For example, if data dots are placed 10 nm apart, the storage density would be over 6 terrabits per square inch. Conventional storage densities are on the order of 100 gigabits per square inch.

Biological Force-Displacement Probe:

Biological science is a large industry, and understanding biological phenomena has been quite allusive. Having new tools which can precisely manipulate and measure forces and displacements will lead to new theories, experiments, and exploitations for human benefit. For example, forces governing virus molecular motors, protein folding, associating physiological characteristics to genes, designer drugs, etc. The EMM design shown in FIGS. 20-23 discussed below or other suitable design, along with design modifications, may prove to be indispensable for enabling biological force-displacement tools.

Figure 22:
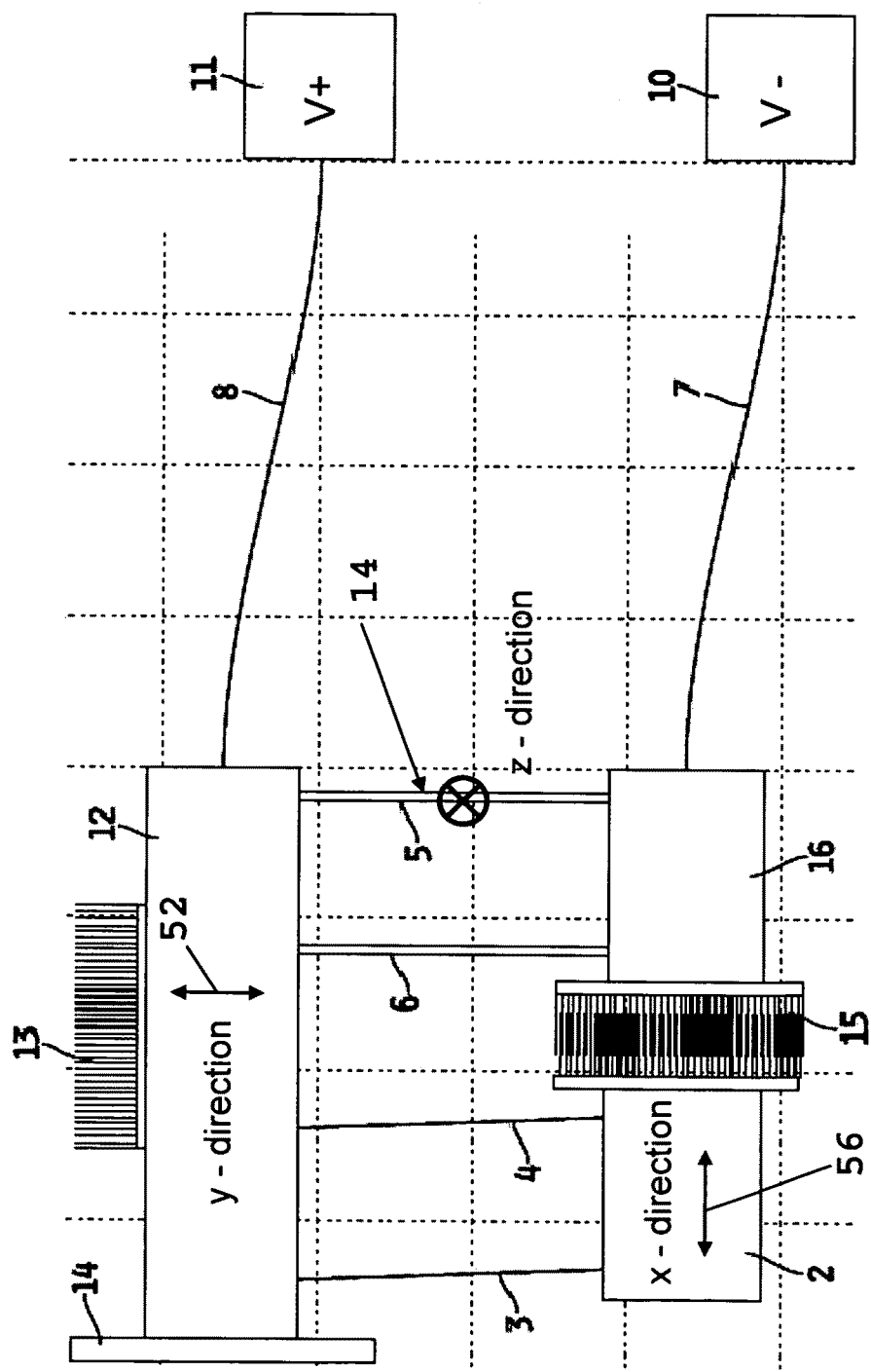
Figure 23:
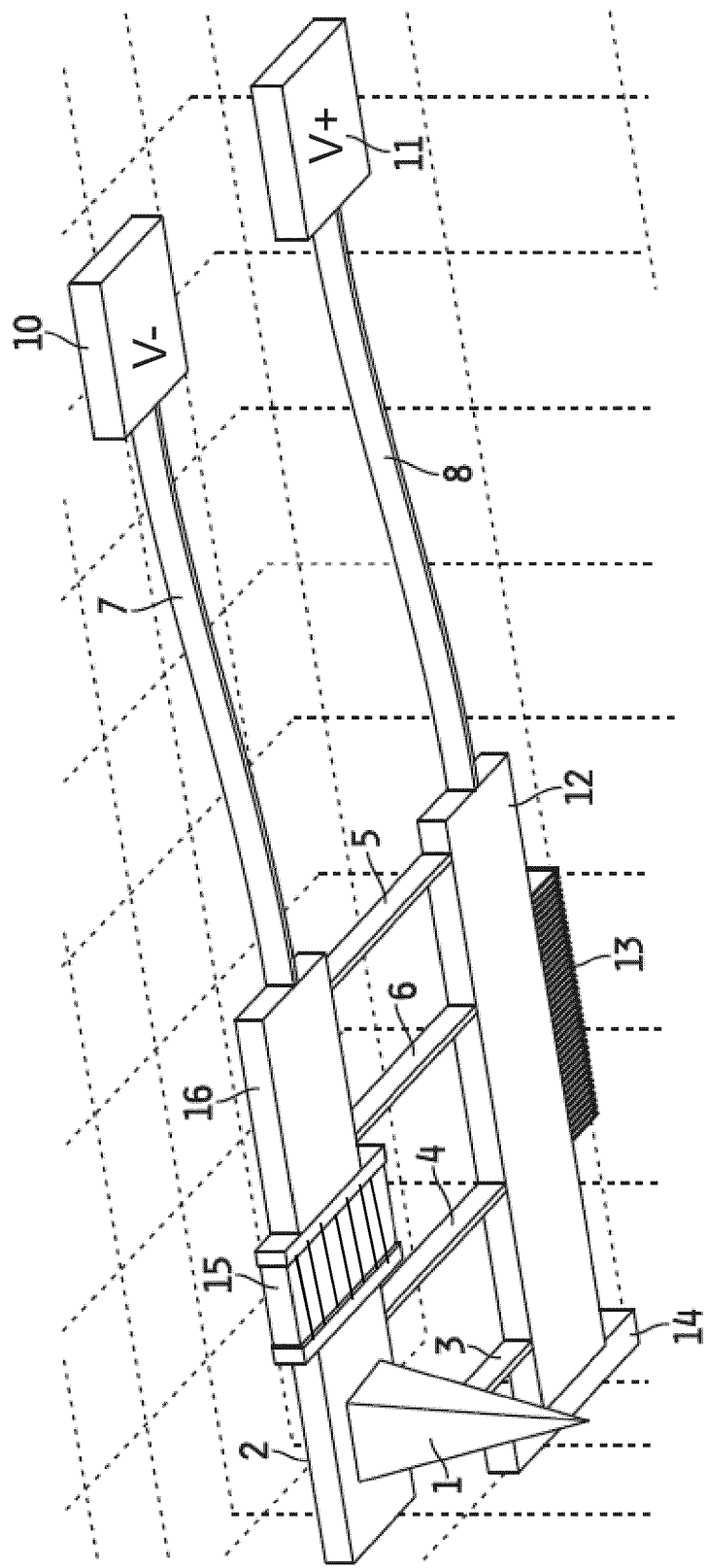
Figure 24:
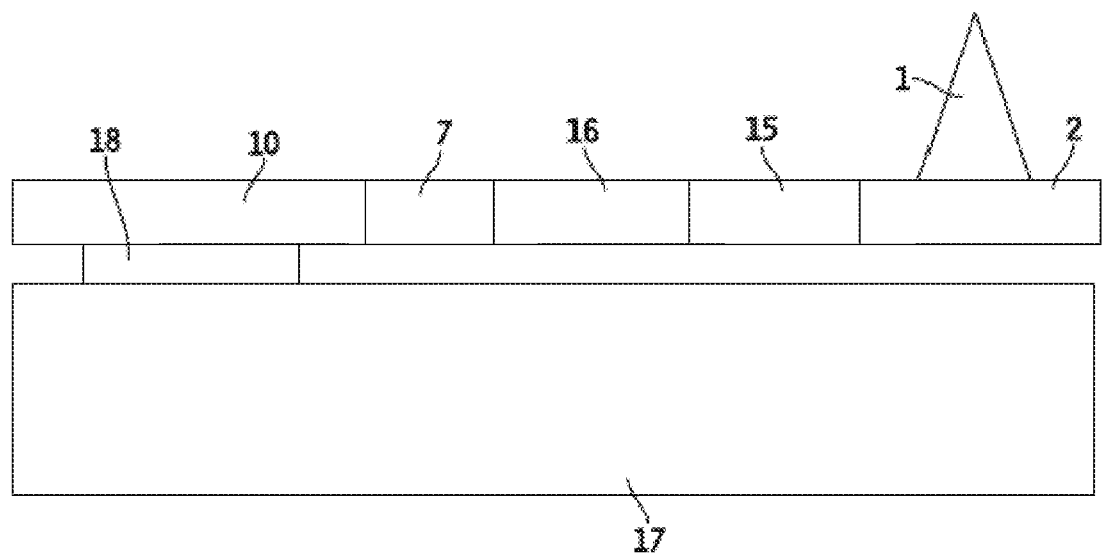
Figure 25:
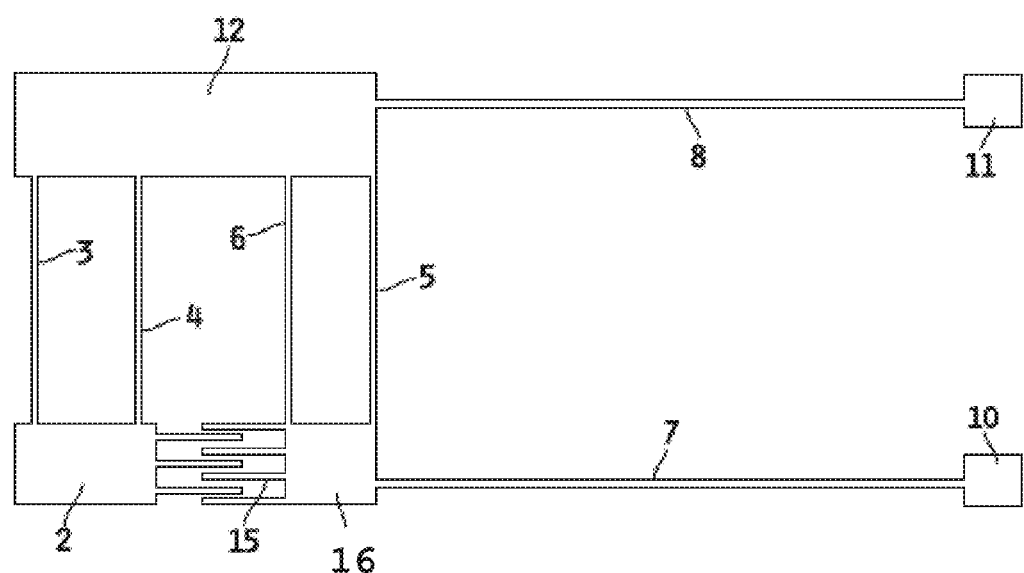

Referring to FIGS. 20-25, a general structure for nanometer-scale sensing and action with three degrees of freedom is illustrated. The anchors 10 and 11 and the moveable structure are shown. The material of the microstructure is conductive, such as doped silicon. The anchors 10 and 11 are generally fixed to the substrate 17 through an insulator, such as silicon dioxide 18 as best shown in FIG. 24. The probe tip 1 may be attached after the fabrication of the planar structure or directly fabricated onto the planar structure. Other applications may require a flat platform without the probe tip 1.

Three degrees of freedom are as follows. The two flexures 7 and 8 together with comb drive actuator 13 provide the first degree of freedom. The flexibility of the structure together with the electrostatic actuator 14 provides the second degree of freedom. The two flexures 3 and 4 together with a monolithic comb drive 15 provide the third degree of freedom.

A monolithic comb drive 15 is used for the third degree of freedom. An electric potential difference between the comb fingers of 15 is produced by applying an electric potential difference between the anchors 10 and 11. An electric current travels from anchor 11 to anchor 10. Since the semiconductor is resistive, a potential drop develops across the comb drive 15. Upon deflection of flexures 3 and 4, there is a change in capacitance in 15 that can be sensed through a capacitance meter connected to anchors 10 and 11. This change in capacitance is used to determine both deflection and force. By increasing the electric potential difference between anchors 10 and 11, the voltage will increase across the monolithic comb drive 15, which can be used to increase the applied comb drive force.

The system of FIGS. 20-25 may be used as a scanning probe microscope (SPM) as discussed above. Drives 13 and 15 deflect the SPM in-plane, while electrostatic actuator 14 deflects the SPM out of plane. The SPM may be used as a passive SPM to sense forces on or displacement of the probe tip 1. Alternatively, SPM may be used actively by driving drive actuator 15, comb drive 13 or electrostatic actuator 14 to move the probe tip 1 and apply forces with the probe tip 1.

The function of the two structures 5 and 6 is to produce a large potential difference between plates 12 and 16. The potential of plate 2 is about the same potential as plate 12. The potential of plate 16 is less than the potential of plate 12. See the finite element simulation in FIG. 25. Actuators 13 and 15 act like capacitors and flexures 3, 4, 7 and 8 and structures 5 and 6 act as resistors to effectively form an RC circuit as discussed below.

Fabrication: FIG. 24 shows a cross section of microfabrication processing, if silicon-on-insulator (SOI) processing is used. Given the topographical layout of the structure, the device may be fabricated by one of several available foundry services, such as MUMPs processes. Once the microdevice is fabricated, a probe tip 1 may be attached onto platform 2. Sensing and actuation electrodes may be wire bonded to anchors 10 and 11, the opposing electrode to comb drive 13, and the opposing electrode 14. Once the sensing and actuation electronics are configured, the microdevice may be flipped over, so that the probe tip is pointed downward, to function as a 3 degree of freedom atomic force microscope.

In contrast the conventional one degree of freedom atomic force microscope (AFM) with a range of about 5 microns; the present device has operates with 3 degrees of freedom and a much, much larger displacement range. The conventional AFM is generally a passive device; the present device may perform actively or passively. The conventional AFM uses light beam reflection to detect displacement. The present device uses capacitance for sensing, applied force and displacement, and it used voltage for applying its own force. The conventional AFM is large in size, requiring the area of a desktop, while the present device is the size of a small microchip. The conventional AFM operates in tapping mode with one degree of freedom, while the present device may operate in tapping mode with 3 degrees of freedom.

Figure 20:
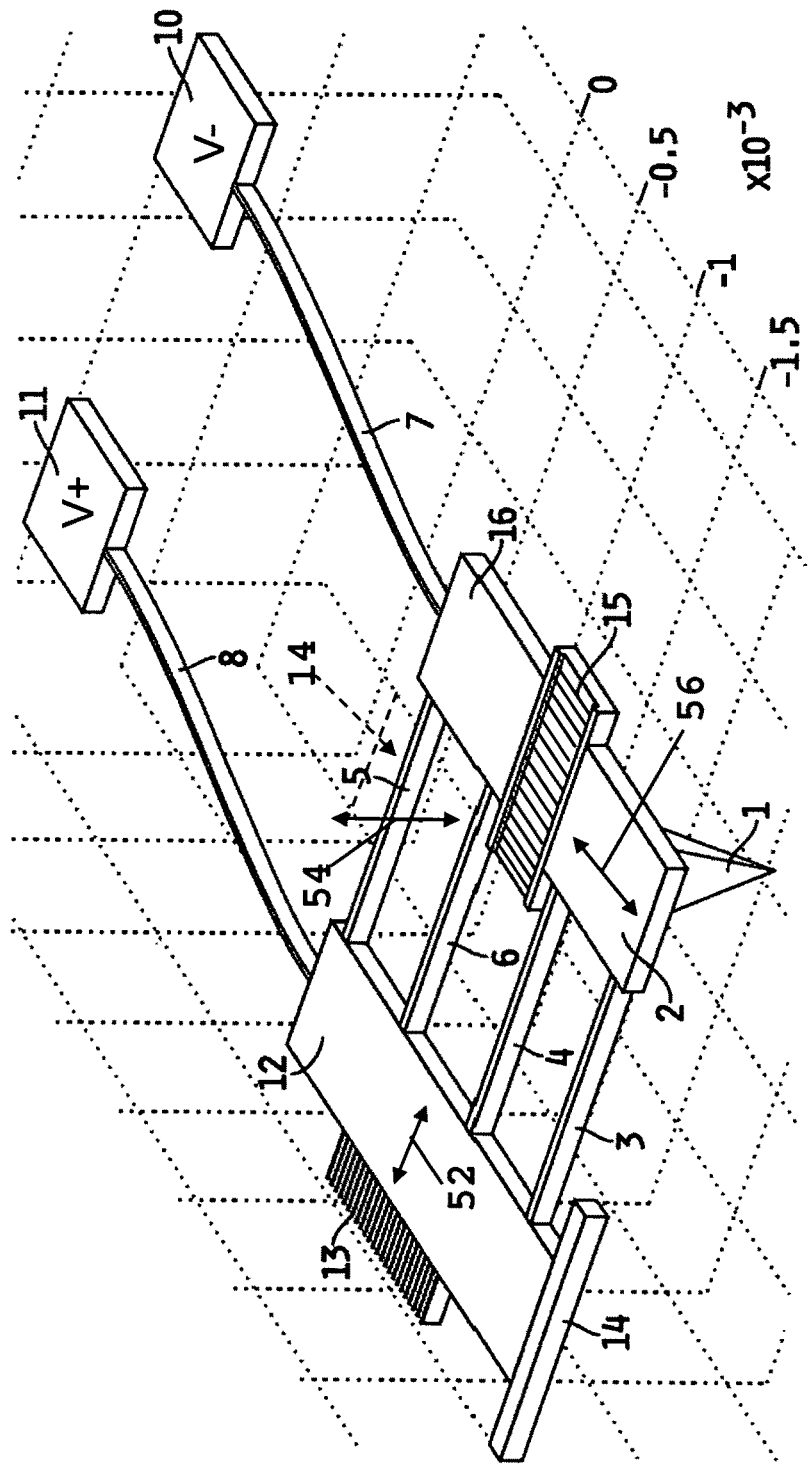
FIGS. 20-25 show an illustrated embodiment of a scanning probe microscope having a monolithic comb drive and three degrees of freedom of movement.

With respect to scanning probe microscopes (SPMs), an illustrated application of the monolithic comb drive 15 is shown in FIGS. 20-23, where a probe tip 1 is attached to a plate 2 that translates in-plane and out-of-plane. The comb fingers that are attached to this plate 2 are those of the monolithic comb drive 15. In total, there are three actuators shown in FIGS. 20-23 labeled as actuators 13, 14 and 15. The degree of freedom for each actuator 13, 14 and 15 is indicated with arrows 50, 52 and 54, respectively. Actuator 13 is a conventional in-plane comb drive actuator. Actuator 14 is an out-of-plane actuator, and actuator 15 is the monolithic comb drive. Two pairs of compliant fixed-guided beams 3 and 4, 7 and 8 provide deformable flexures. In an illustrated embodiment, flexures 7 and 8 may have a length of about 1000 μm, a width of about 10 μm, and a thickness of about 50 μm. Other structures 5, 6 do not significantly deform. Besides the anchors 10 and 11, the moveable parts of the structure are shown. That is, the fixed stators of actuator 13 and actuator 14 are not shown in FIGS. 20-23. The stator of actuator 15 actually translates in the y-direction as shown by arrow 52 in FIG. 22. The independent direction of motion for each actuator 13, 14, 15 is indicated in FIG. 20 with arrows 52, 54 and 56, respectively.

Figure 21:
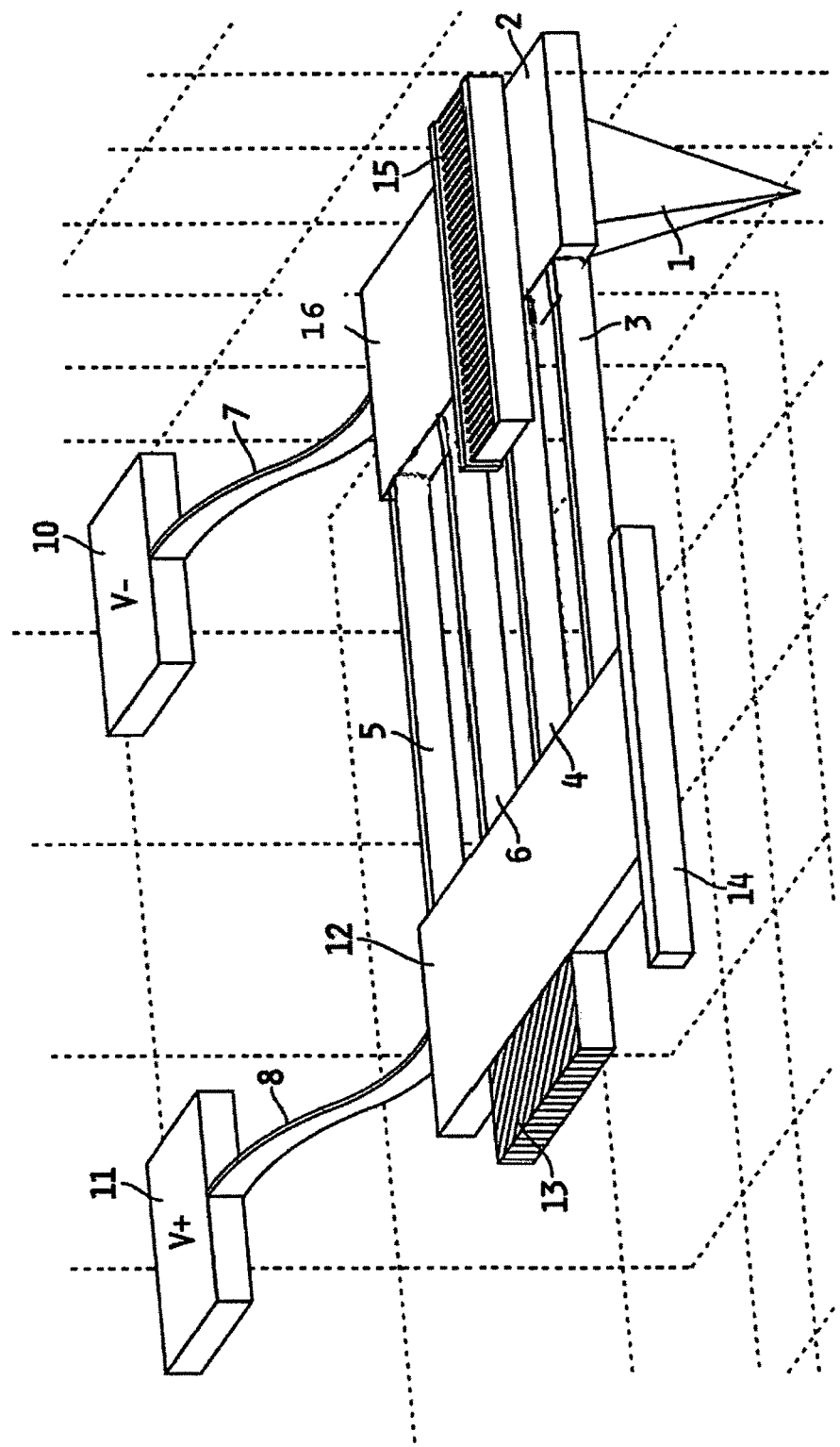

FIG. 22 is a top view of the scanning probe microscope shown in FIGS. 20, 21 and 23. The probe tip 1 is underneath the plate 2 of monolithic comb drive, actuator 15. The range of motion is primarily determined by the length of the comb fingers of actuator 13. As shown in FIG. 22, actuator 13 is a conventional in-plane comb drive actuator (its fixed stator is not shown). Actuator 13 is effectively connected to a pair of fixed-guided flexures 5, 6 that extend from plate 12 to plate 16. This pair of fixed-guided flexures 5, 6 resists rotation about the z-axis illustrated by arrow 54 in FIG. 20. That is, the primary function of actuator 13 is to translate the probe tip 1 in the y-direction as shown by arrow 52.

Actuator 15 is the monolithic comb drive. Similar to actuator 13, actuator 15 is effectively connected to a secondary pair of fixed-guided flexures 3, 4. However, instead of this pair of flexures 3, 4 being fixed to a substrate, the flexures 3, 4 are fixed to a moveable plate 2. Such a configuration allows independent translation in the x-direction illustrated by arrow 56. The mechanism producing the actuating voltage about monolithic comb drive 15 is discussed below.

Actuator 14 is used to achieve translation in the out-of-plane z-direction as illustrated by arrow 54 in FIG. 20. Illustratively, actuator 14 includes an electrode coupled to plate 12. Electrode 14 illustratively has the same voltage as plate 12. An anchor or stator of actuator 14 is not shown in FIGS. 20-23 for clarity. Application of a voltage to the anchor of actuator 14 causes movement of the electrode 14, and therefore plates 12, 16 and 2 and probe tip 1 in the z-axis direction 54. In another embodiment, the actuator 14 may be located adjacent structure 5 as shown reference number 14 with dotted lines and in FIG. 20. The mechanism of actuation of actuator 14 is similar to vertical comb drive actuation, where pairs of stators are positioned on either side of the fixed-fixed beam. Here, the 50 µm thick structural layer or plate facilitates large out-of-plane comb drive actuation. For thin structural layers, z-direction actuation may be achieved by positioning a parallel electrode gap above the structure.

The monolithic comb drive actuator 15 facilitates an additional degree of freedom for comb actuators because its base may itself be allowed to displace. Since the drive is monolithic, both the mechanical and electrical properties of the structure are used to achieve an electric potential difference across the monolithic comb drive 15.

Figure 26:
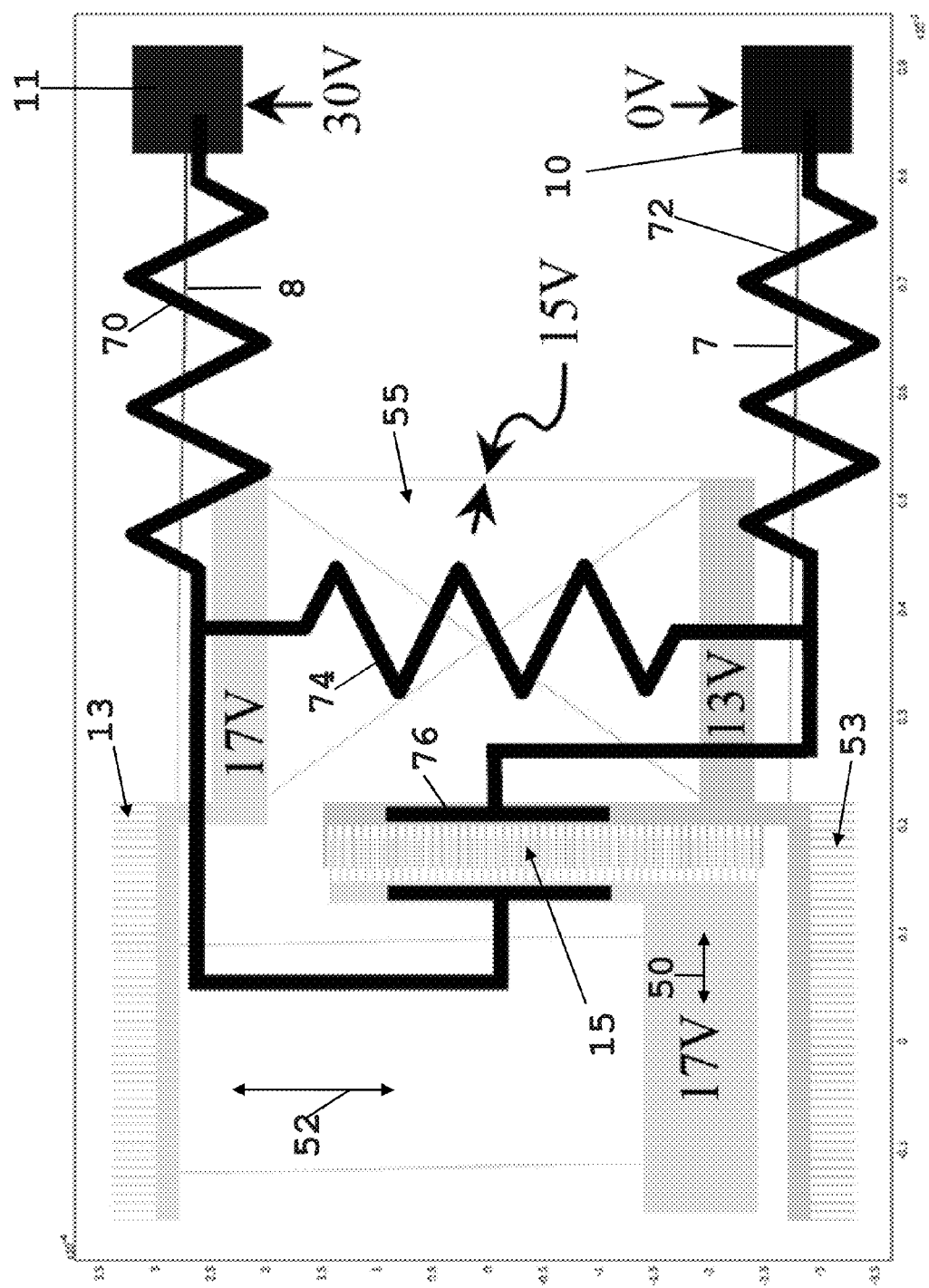
FIG. 26 is a voltage surface plot of the monolithic comb drive of FIGS. 20-23.

FIG. 26 is a voltage surface plot of the monolithic comb drive of FIGS. 20-23. Voltages are shown on the surfaces. 30V is illustratively applied across bond pads or anchors 10 and 11. A potential drop of 4.01V results across the trusses 55 and monolithic comb drive 15, which causes the x-deflection in the direction of arrow 50. The y-deflection in the direction of arrow 52 is due to a potential difference applied at the comb drive actuator 13. The stators of the comb drives are not shown. The monolithic drive 15 illustratively includes a single continuous structure, as opposed to the two-piece design of conventional comb drives. Therefore, the entire monolithic comb drive 15 is moveable. There is a voltage drop across the guided-anchored flexures 7 and 8. Conventional comb drives typically do not have this attenuation in voltage.

The structural configuration shown in FIG. 26 is slightly different to that shown in FIGS. 20-23. For example, in FIG. 26 there are two y-direction actuators 13, 53, and a cross-beam truss 55 has been added to the out-of-plane actuator 14. In the simulation of FIG. 26, an electric potential difference is applied across the two anchors 10 and 11. Due to the resistivity of the structural material, there is a continuous electric potential difference in going from one anchor 11 to the other anchor 10. This produces a potential drop across the truss 55. This potential drop across the truss 55 yields an identical potential drop across the monolithic comb drive 15, causing deflection.

Compared to a conventional comb drive 15, the applied voltage of a monolithic comb drive is significantly attenuated. This is due to the relative resistance of the flexures 7, 8 between the bond pads 10, 11 and the monolithic comb drive 15. An electronic point of view is also illustrated in FIG. 26, where the resistance of the flexures 7, 8 and the capacitance of the monolithic comb drive 15 are graphically illustrated as electronic components. The result is an RC circuit that has two resistors in series 70, 72 with a parallel resistor-capacitor element 74, 76. A voltage drop across the series resistors is due to the fixed-guided flexures 7 and 8, and the voltage drop across the parallel resistor is due to the truss 55. In contrast to this RC circuit, the electrical view of a conventional comb drive is often modeled as a capacitor only. The voltage drop across the capacitor 76 is due to the voltage drop across its parallel resistor 74. The circuit may be electrically driven with a static or dynamic voltage or current source. If statically driven, i.e. voltage is maintained with little or no current flow, then effects related to temperature, such as thermal noise and thermal expansion, are reduced. To increase the potential drop across the truss 55, thin beam structures are used because thin beams have a larger resistance than wide beam. To increase structural rigidity, the thin beams are configured as cross-beams to counter shear. A single vertical beam of the truss 55 counters bending. Together, rotation of the monolithic comb drive 15 is reduced while maintaining a large electrical resistance.

Y-Displacement.

Figure 27:
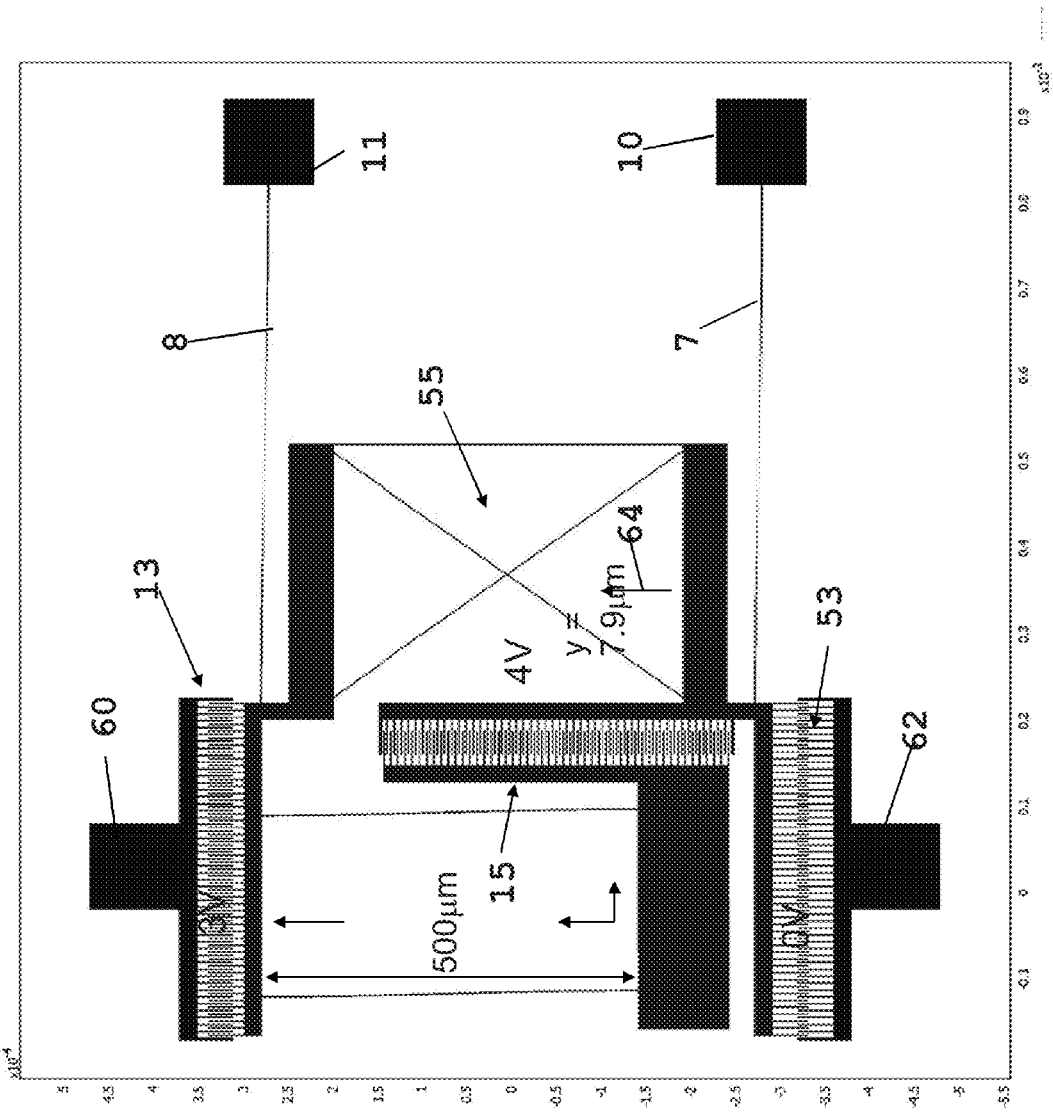
FIG. 27 is a y-displacement surface plot of the monolithic comb drive.

An illustrative surface plot is shown in FIG. 27. The flow of electrical current goes from one bonding pad or anchor 11 to the other 10, through a potential difference of 30 volts. Temperature has a strong dependence on the resistivity of the structural material. Effects due to high temperature are usually undesirable. In such cases, zero or low current operation is preferred. The potential difference is indicated on each of the planar actuators. Stators 60 and 62 for actuators 13 and 53 are shown. Actuator 13 has a potential difference of 3V and actuator 14 has a potential difference of 0V. Actuator 13 illustratively produces the y-displacement of about 8 microns, which translates the entire monolithic drive 15 in the y-direction illustrated by arrow 64. 30 volts in maintained across the two the bond pads or anchors 10 and 11.

In this embodiment, y-displacement is illustrated on the structural surface. Elements 10, 11, 60 and 62 have small or no deflection. Other shown elements have large or maximum deflection. The entire monolithic comb drive 15 translates in the y-direction shown by arrows 64 nearly 8 microns, which is four times larger than the comb drive's 2 micron gap. This is large y-displacement is possible because both the shuttle and stator of the monolithic comb drive 15 deflects as one in the y-direction.

Figure 28:
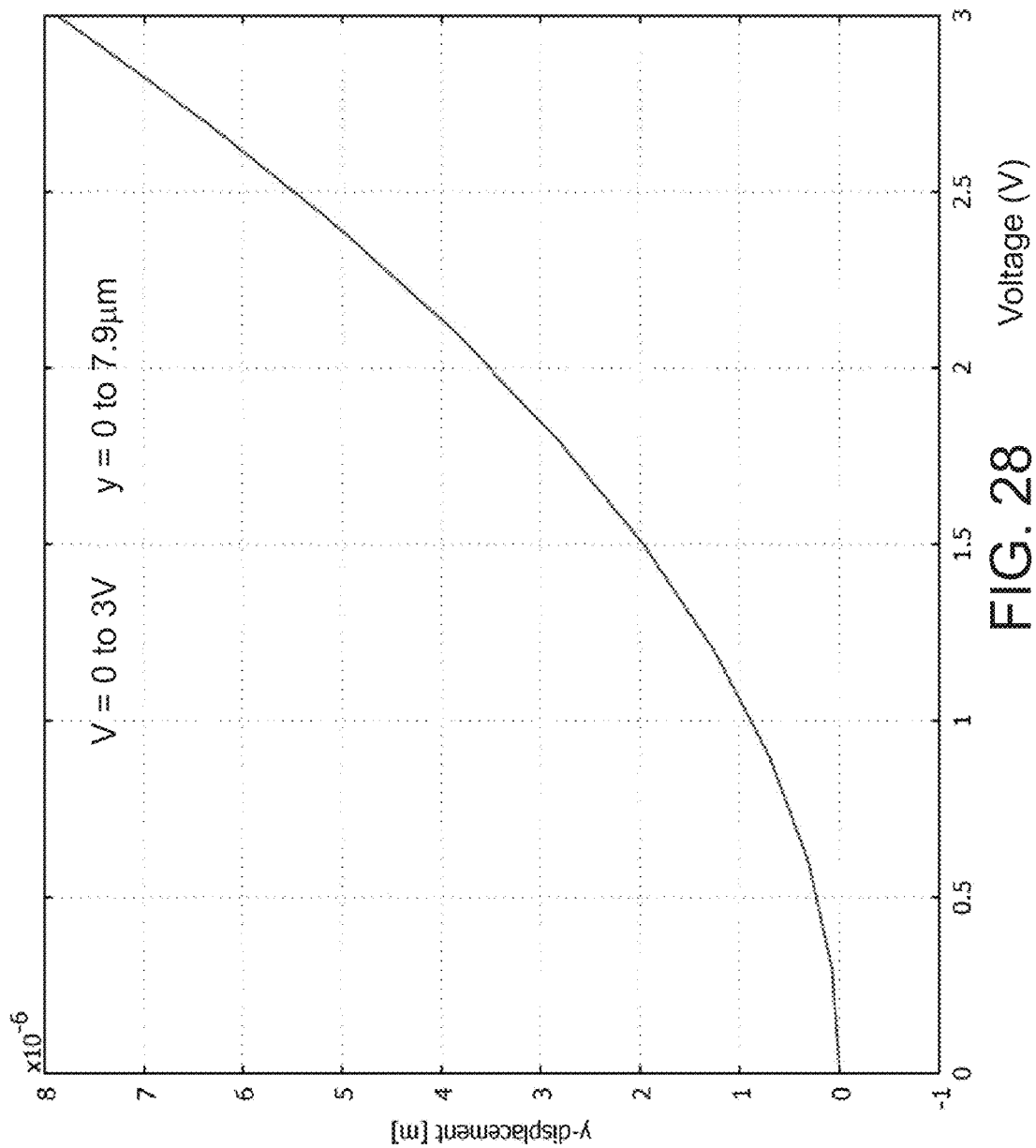
FIG. 28 is an illustrative graph of y-displacement of the monolithic comb drive.

A parameterized plot of y-deflection of the monolithic comb drive 15 as a function of the actuation voltage of the conventional comb drive actuator 13 is shown in FIG. 28. Voltage applied to the pad or anchor 11 is parameterized 0:0.3:3 volts. Deflection is quadratic in voltage.

X-Displacement.

Figure 29:
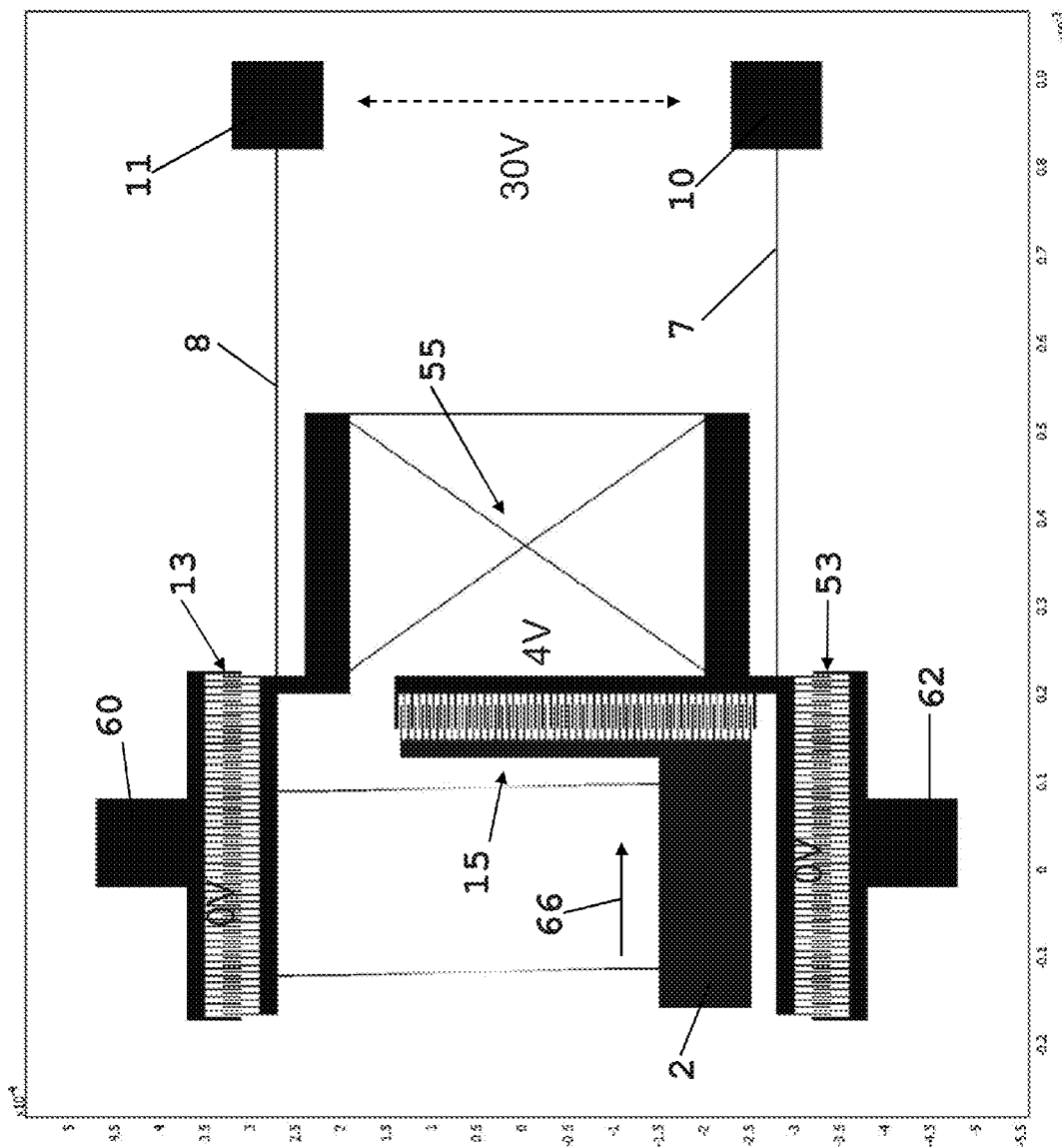
FIG. 29 is an x-displacement surface plot of the monolithic comb drive.

An illustration of an independently-controlled x-deflection of the monolithic comb drive 15 is shown in FIG. 29. A voltage of 30V is applied across the bond pads or anchors 10, 11, which yields a potential difference of 4V across the monolithic comb drive 15 due to a potential drop across the truss 55. This potential difference illustratively produces an x-deflection of 7.6 microns in the direction of arrow 66. The voltage differences across the comb drives 13 and 14 are equal to prevent y-displacement. The only significant deflection is the left-hand, L-shaped side of the monolithic comb drive 15 in FIG. 29 including plate 2 and attached comb fingers.

Figure 30:
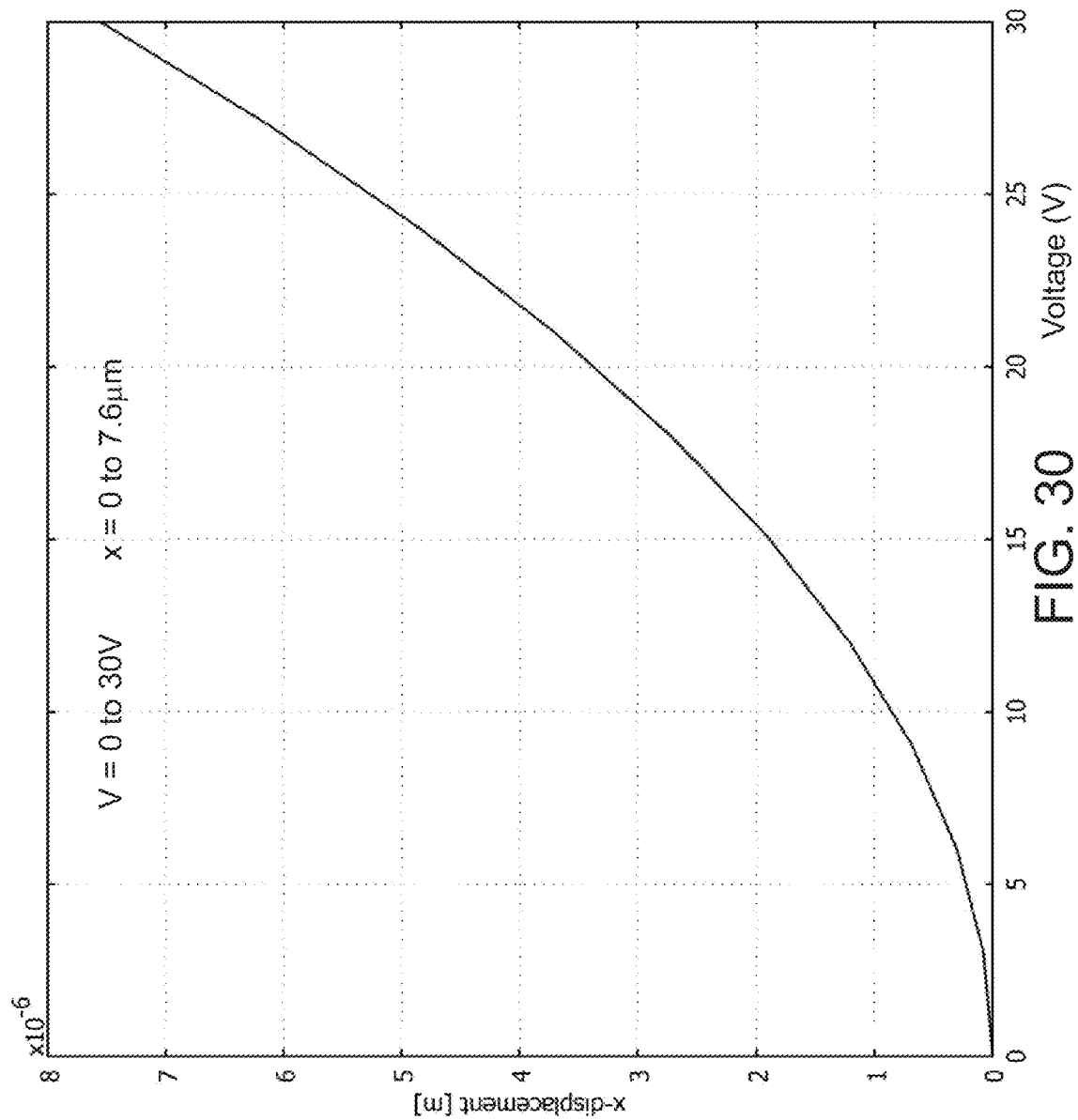
FIG. 30 is an illustrative graph of an x-displacement of the monolithic comb drive.

A parameterized plot of this x-deflection is shown in FIG. 30, where the voltage applied across the two bond pads 10, 11 are parameterized from 0 to 30 volts, implying that the potential difference across the monolithic comb drive 15 is parameterized 0 to 4 volts. Voltage applied across the anchors 10 and 11 is parameterized 0:3:30 volts.

Precision.

In realizing high-precision in sensing and actuation, there have been significant advancements in high-precision micro electro mechanical transduction. Such methods may be readily applied herein to achieve atomic-scale nanopositioning.

The present system and method uses finite element analysis to model a new type of comb drive that may facilitate the development of a large-deflection, high-precision nanopositioner with multiple degrees of freedom. We call this new type of actuator a monolithic comb drive. The actuator is "monolithic" because it comprises a single continuous electromechanical structure, unlike conventional comb drives where the stator and shuttle are mechanically decoupled. The actuation voltage across the monolithic comb drive is due to the voltage drop across its truss. Through simulations and illustrated embodiments, an independently controlled device having large y- and x-deflections are shown. Illustratively deflections of 7.6 to 7.9 microns are obtained using 3 to 4 volts. Larger deflections may be achieved by configuring the system with longer comb drive fingers. 3D lumped analysis was done using Sugar 2 and 2D finite element analysis was done using COMSOL Multiphysics 3.3.

Figure 31:
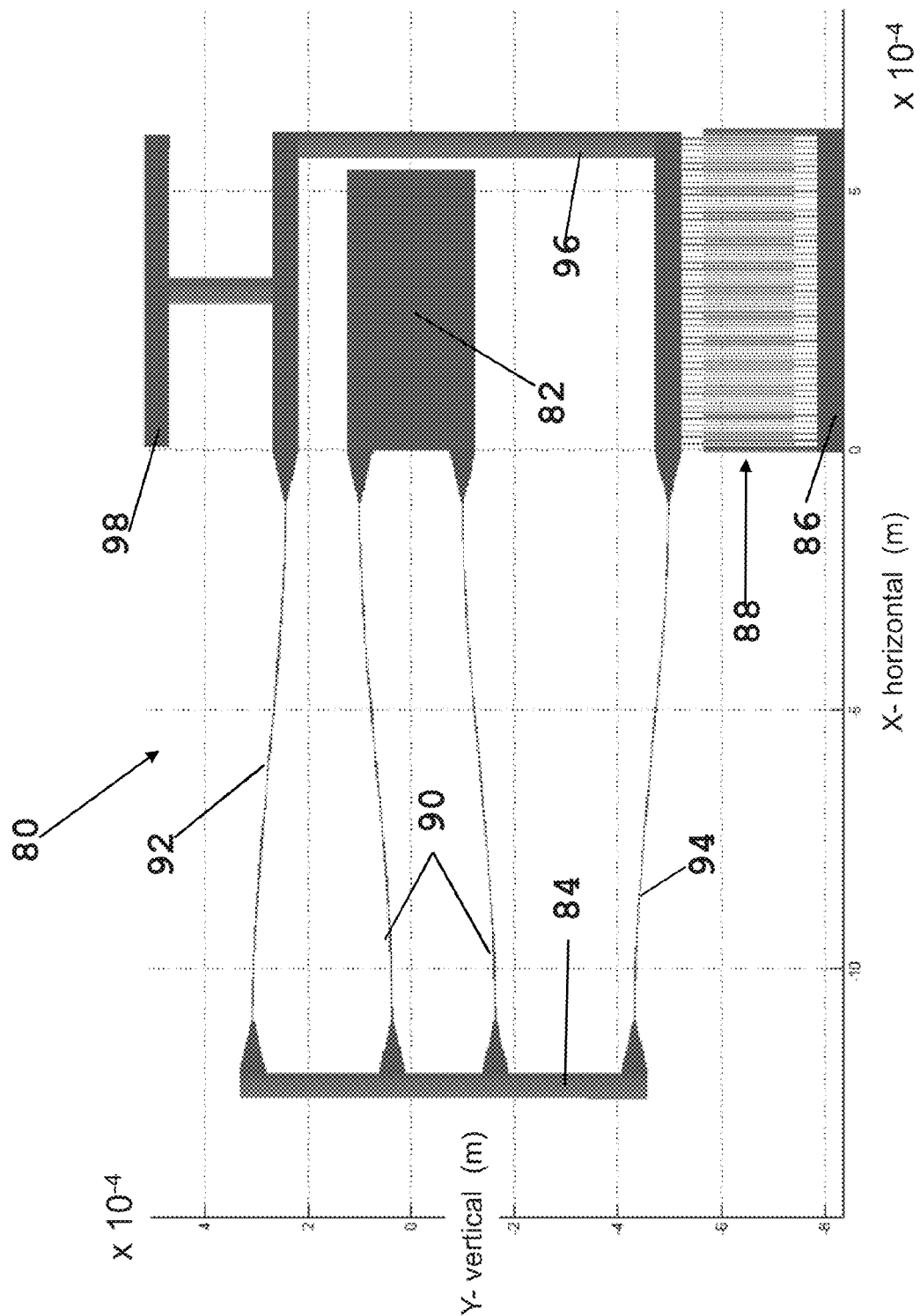
FIG. 31 illustrates an exemplary a one degree of freedom (1-DOF) microtransducer.

FIG. 31 illustrates a one degree of freedom (1-DOF) microtransducer 80 in accordance with another illustrated embodiment of the present invention. The microtransducer 80 illustratively includes anchors 82, 84 and 86 and a comb drive actuator 88. Flexures 90 couple anchors 82 and 84 together. Flexures 92, 94 couple anchor 84 to body 96. An application pad 98 is coupled to body 96. AFM probe tips, biomolecules, or the like, may be attached to the sidewall of the application pad 98. Illustratively, the dimensions of the sidewall of the application pad 98 may be about 50 μm×300 μm.

The device 80 illustratively includes the following specifications:
  Layer thickness h=50 μm
  Overall length (left-to-right)=3 mm
  Comb drive gaps g=3 μm
  Flexure widths w=3 μm.

Figure 32:
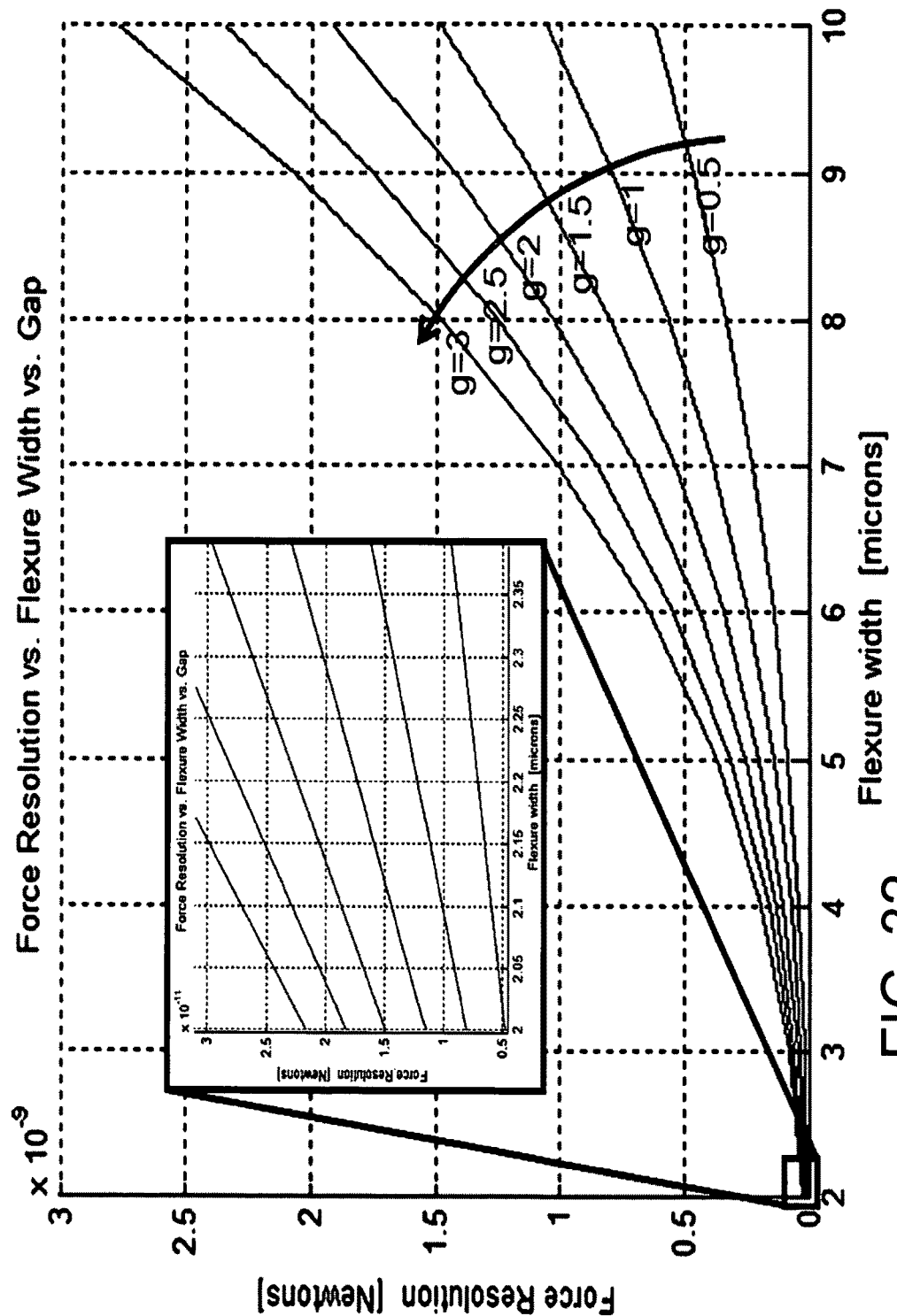
FIG. 32 is a graph illustrating comb drive force resolution vs flexure width vs gap spacing for actuators.

FIG. 32 illustrates comb drive force resolution vs flexure width vs gap spacing for actuators. The resolution of force improves from nanonewtons to piconewtons with smaller flexure width w and smaller gap spacing g.

Figure 33:
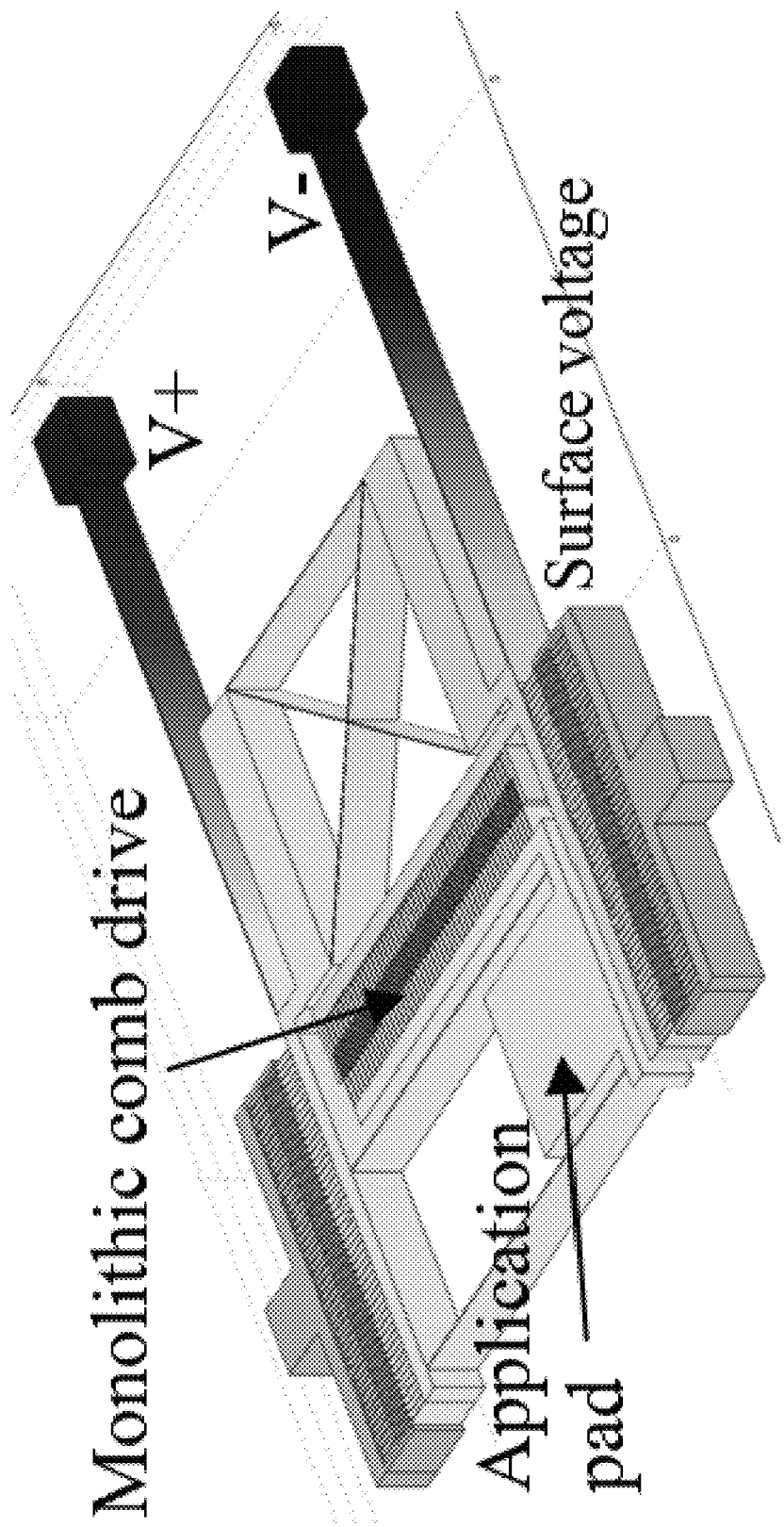
FIG. 33 illustrates another embodiment of a monolithic comb drive.

FIG. 33 illustrates another monolithic comb drive. X and Y directions may be independently controlled.

Figure 34:
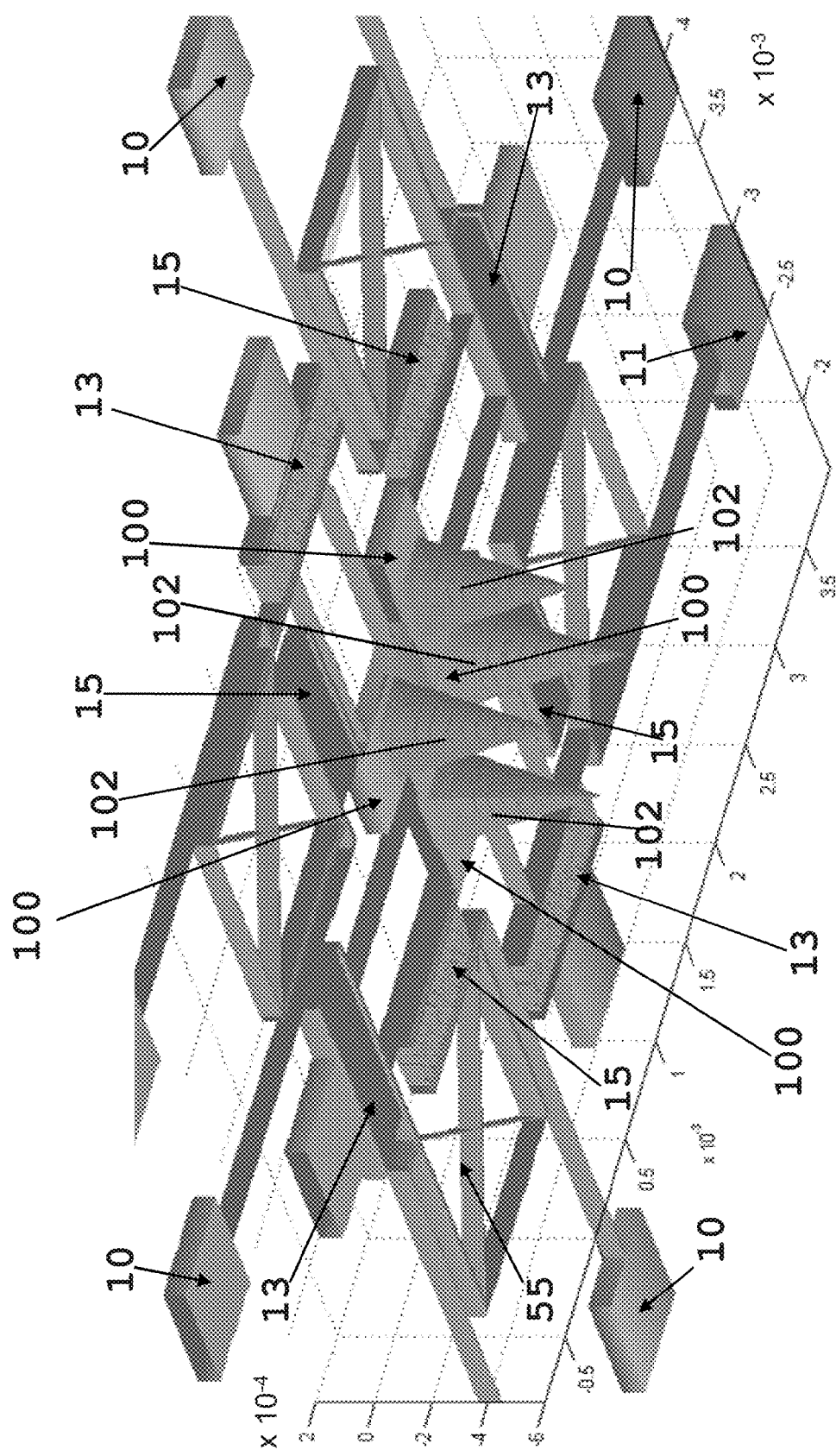
FIG. 34 illustrates a multiplexed embodiment of a monolithic comb drive system including four separate probes.

FIG. 34 illustrates a multiplexed version of a monolithic comb drive system. Illustratively, four microtransducers are configured such that their application pads 100 are in close proximity to each other. The four probe tips 102 may be independently controlled for movement from 10s to 100s of microns by a controller (not shown). Those elements in FIG. 34 having the same reference numbers as those used above perform the same or similar function in the multiplexed version of FIG. 34.

Use of Electrostatic Force Feedback to Reduce Noise-Induced Vibrations in Micro and Nanometer-Scale Systems There are numerous benefits of micro- and nanometer scale electromechanical systems (M/NEMS) including low cost, low power, miniaturization, integration, and high performance. However, the high performance of M/MEMS has been limited due to the inherent noise-induced vibrations. Noise comes from various sources. For example, there is temperature fluctuation noise due to random fluctuations in temperature, Johnson noise due to random motion of charged carriers in resistive elements causing effective random voltages, Brownian motion noise due to the fluidic molecular agitation of the surrounding atmosphere, surface contamination and outgassing due to adsorption and desorption of atmospheric contamination which effectively ages the device, 1/f noise, noise in the sustaining circuitry, stray capacitive noise, self-heating noise, drive power noise, etc. In macroscale systems, such noise is generally insignificant. However, when dimensions become small, such noise becomes significant and may cause instability. Noise severely limits the applications of M/NEMS.

For example, let's consider the thermally-induced vibration of a microscale cantilever. From quantum statistical mechanics, the expected potential energy in a particular dimension stored in an mechanical structure is equal to the thermal energy temperature as $$\frac{1}{2}k\langle x\rangle^2 = \frac{1}{2}k_BT,$$

where k is the stiffness, $k_B=1.38\times10^{-23}$ J/K is Boltzmann constant, T is the temperature, and x is the displacement amplitude of oscillation. Given a micro-cantilever with an effective stiffness of $7\times10^{-4}$ N/m and temperature of T=300K, we find that the expected amplitude to be $\langle x\rangle$~3 nm. Such an amplitude of vibration severely limits position to a resolution of about 6 nm, or about 30 silicon atoms, which not sufficient for molecular scale manipulation. This is the problem that atomic force microscopes (AFMs) suffer from. And if the uncertainty in displacement is multiplied by stiffness, the resulting uncertainty in the resulting force is $F=k\langle x\rangle$~1 pN. However, the stiffness of AFMs is not well-known. So unfortunately, uncertainty in force is increased to ~10 . . . 100 pN.

Figure 35:
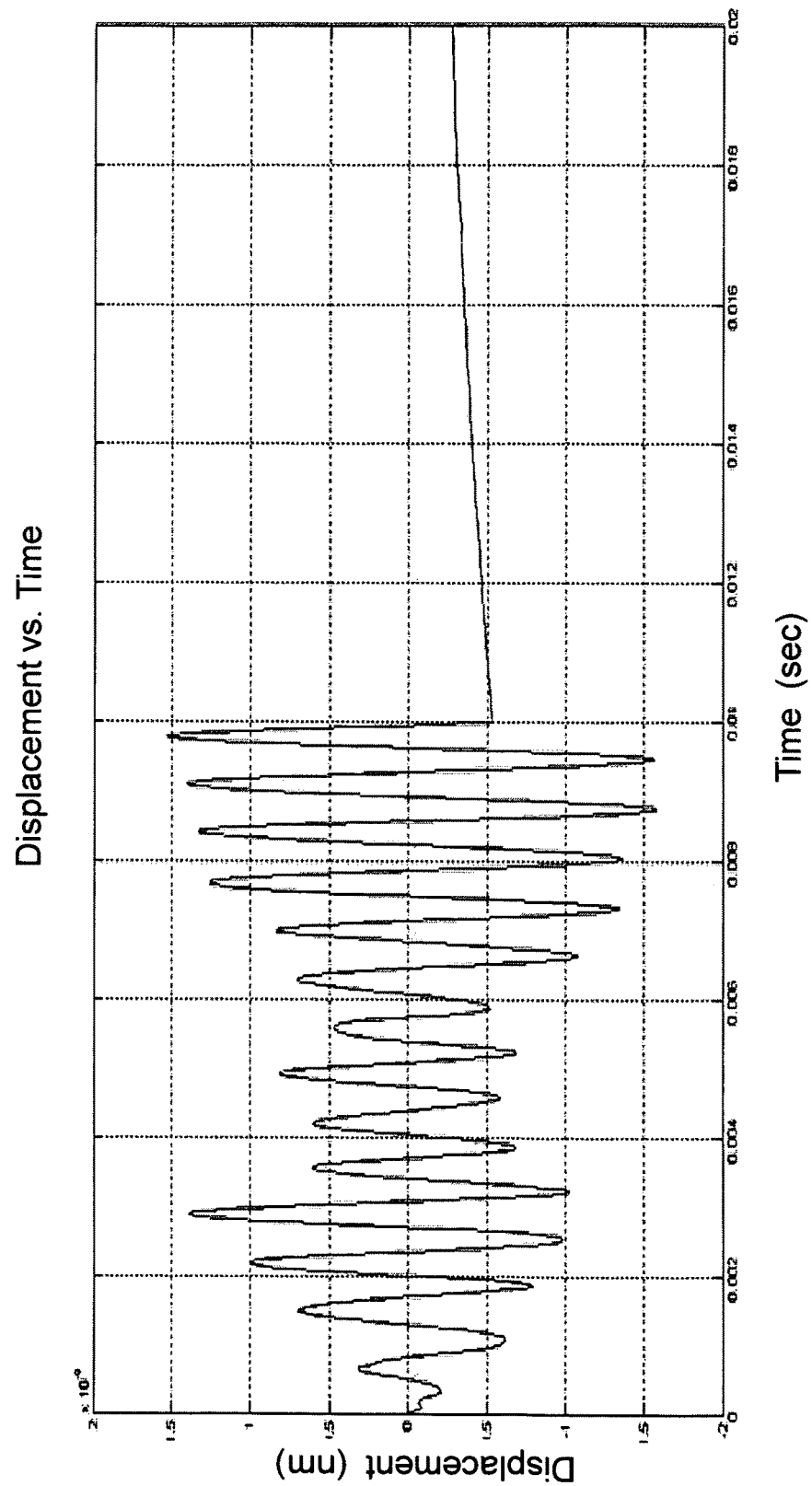
FIGS. 35-39 are graphs illustrating tests results for a system using electrostatic force feedback to reduce noise-induced vibrations in micro and nanometer scale systems.
Figure 36:
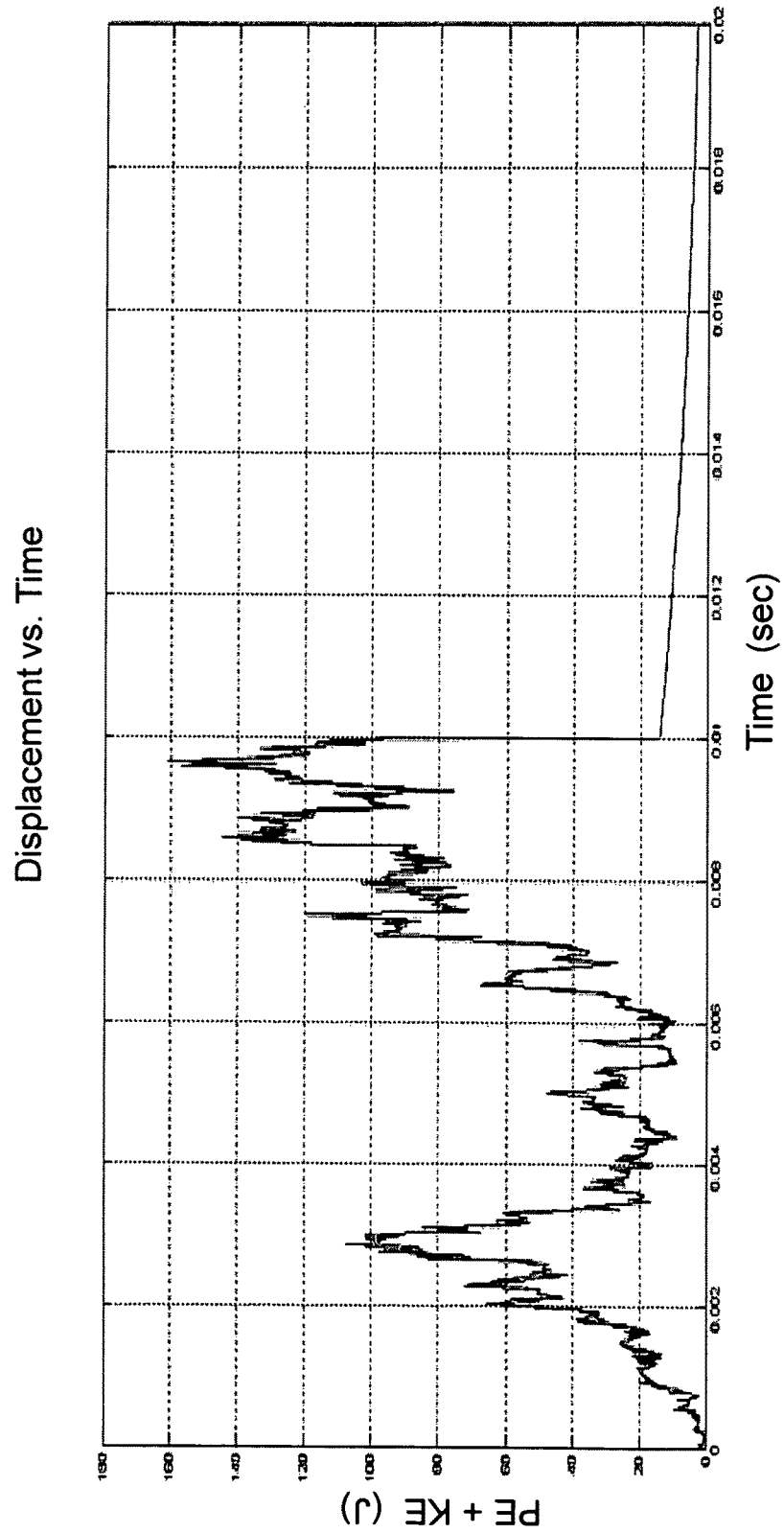
Figure 37:
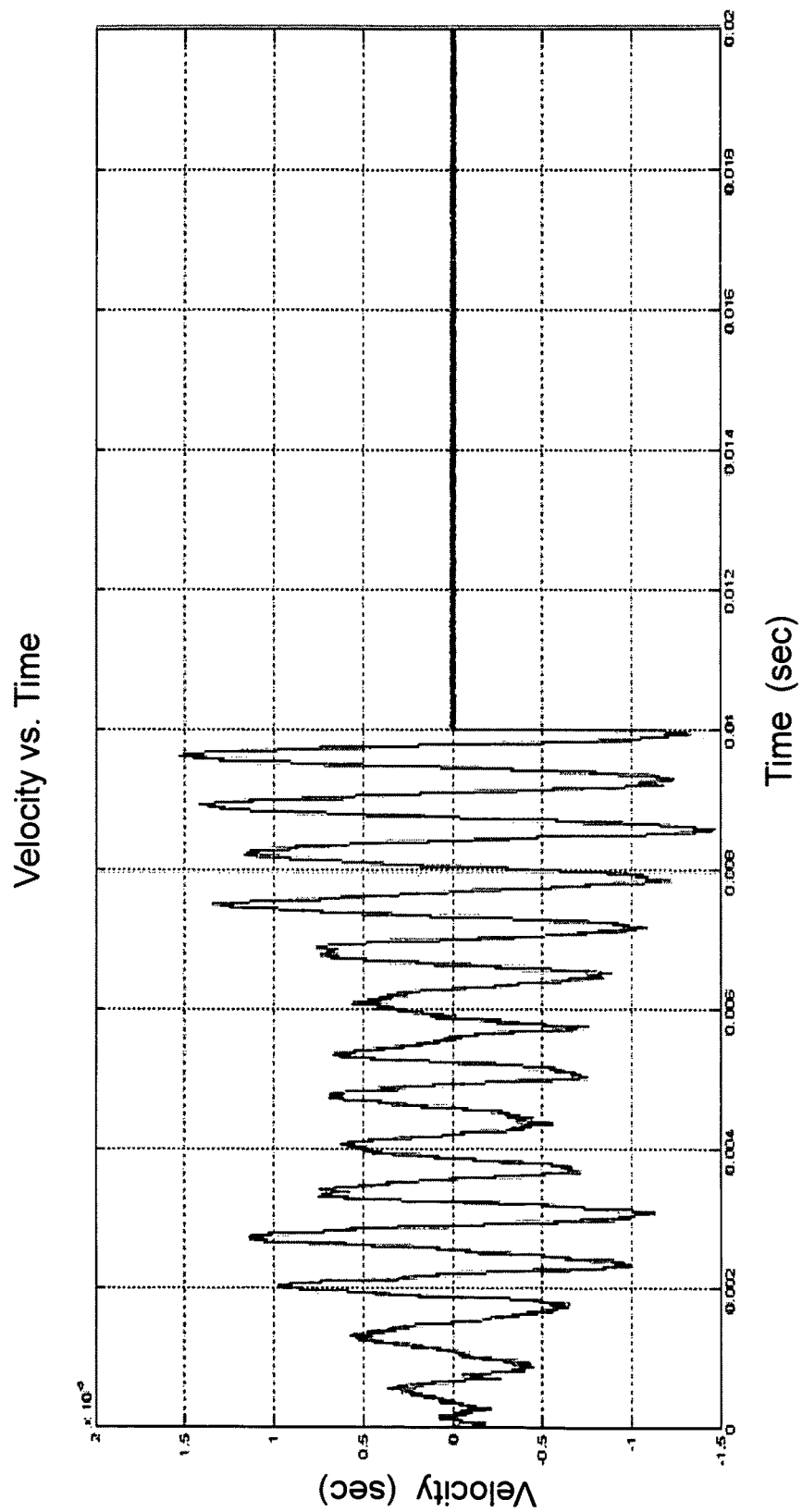
Figure 38:
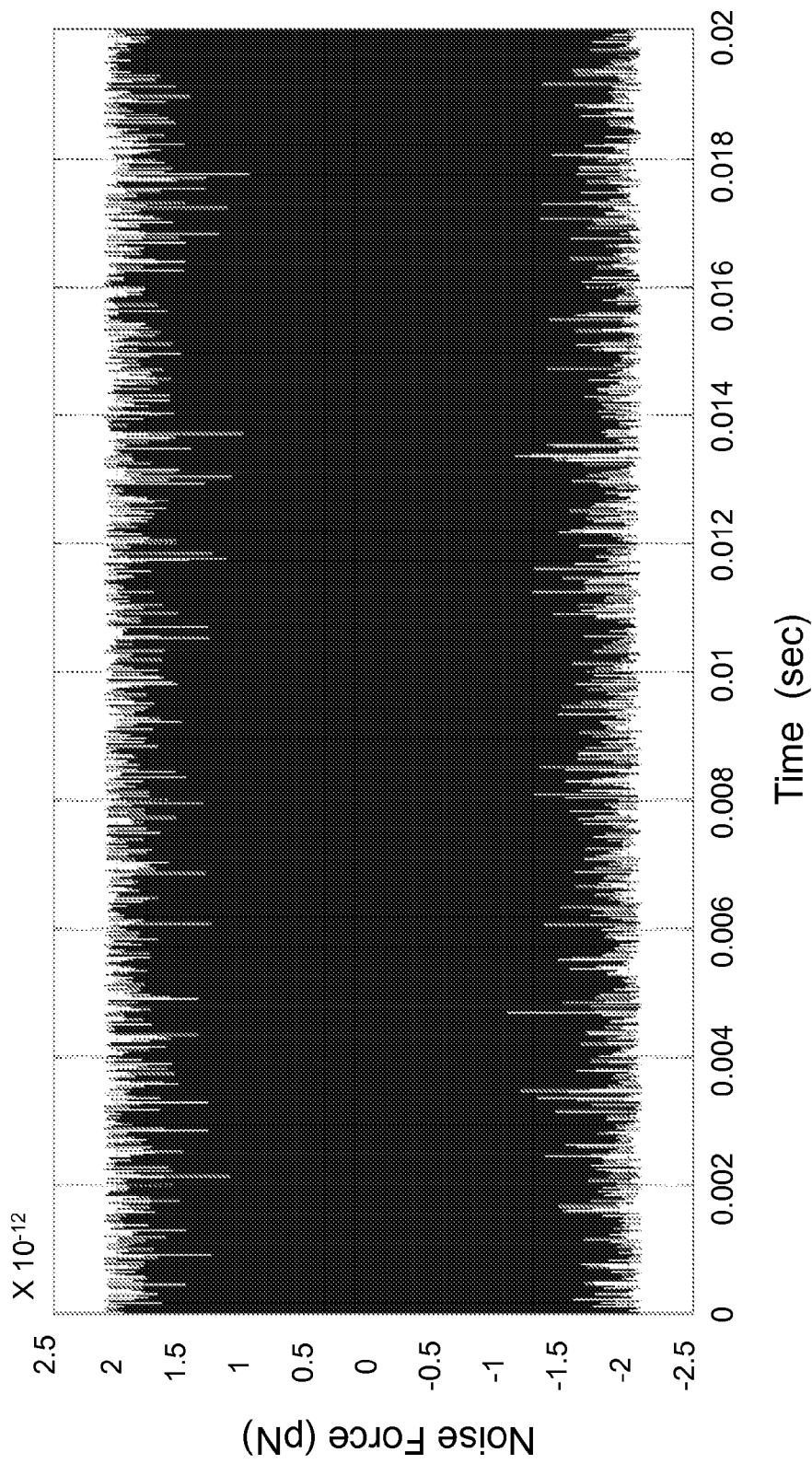
Figure 39:
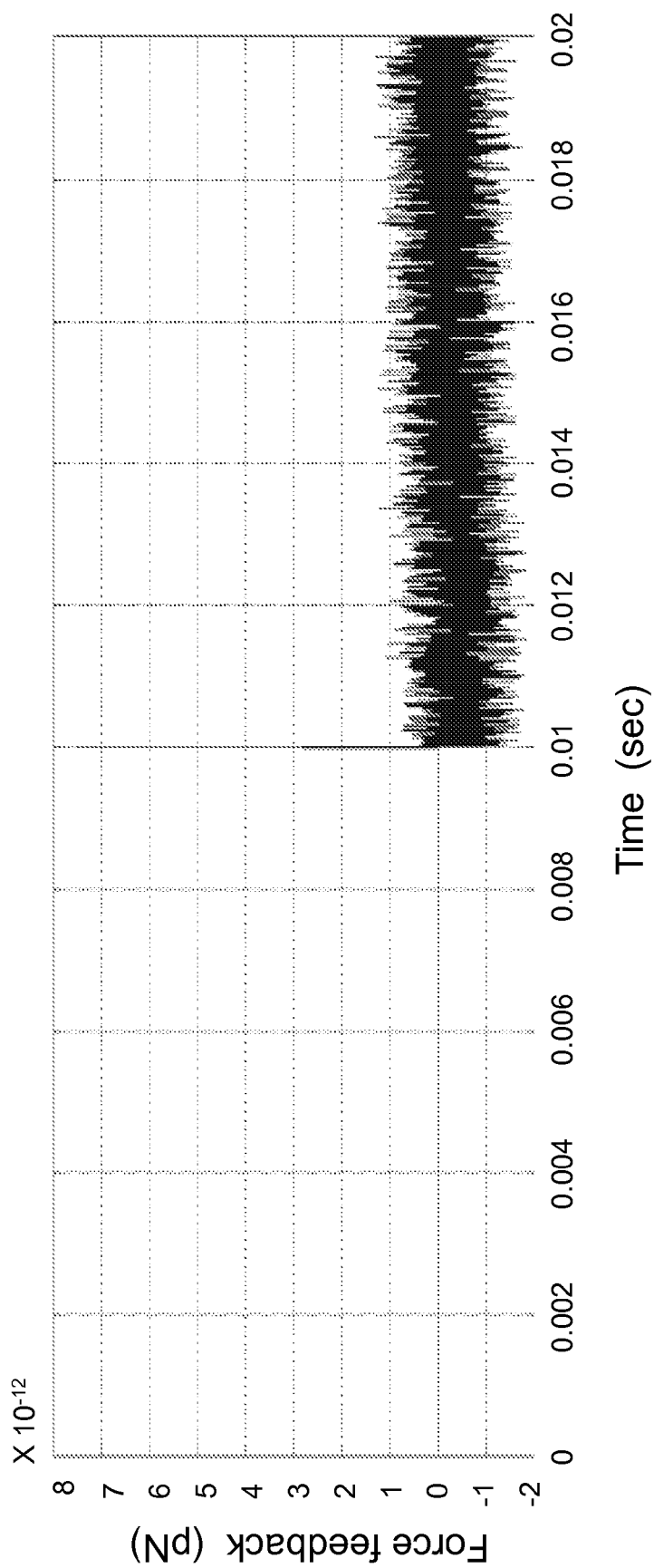

In an illustrated embodiment, to counter the noise-induced mechanical vibrations. Electrostatic force feedback is used. That is, by placing an electrostatic sensor/actuator (comb drive) at the point of largest vibration on the structure, the vibration is electrically sensed, and then subsequently feedback a countering electrostatic force. This force will counter the noise-induced resonant amplitude. Data in the form of simulation is shown in FIGS. 35-39. Given a microdevice with an effective stiffness of $7\times10^{-4}$ Nm, mass of $9\times10^{-12}$ kg, and temperature of T=300K, by applying white noise (FIG. 39) to the structure, FIG. 35 shows that the device approaches its resonant frequency as quantum statistical mechanics predicts.

Yet through the latter half of the simulation, we apply electrostatic force feedback (FIG. 39) to the vibrating structure. As seen in the FIGS. 35-37, the resonant amplitude effect of random white noise is significantly reduced when the feedback force is applied. In this case, the amplitude is reduced from the length of 30 atoms to 1 atom.

With regard to the embodiment of FIGS. 20-25, for example, the comb drive 15 may be used to sense mechanical vibrations of the apparatus. A controller may use a feedback signal of the sensed vibrations to counter the noise-induced mechanical vibrations. For example, a signal opposite to the vibration may be applied to counter the noise-induced mechanical vibrations. In other embodiments, other suitable sensors may be used, such as for example a gyro-type sensor.

While the invention has been illustrated and described in detail in the drawings and foregoing description, the description is to be considered as illustrative and not restrictive in character. Only the illustrated embodiments, and such alternative embodiments deemed helpful in further illuminating the illustrated embodiments, have been shown and described.

Therefore, variations and modifications exist within the scope and spirit of the present invention as defined in the following claims.

What is claimed is:

1. A scanning probe microscope apparatus comprising:
   a probe tip coupled to a first plate moveable in an x-axis direction, a y-axis direction and a z-axis direction;
   a second plate coupled to the first plate by at least one flexure;
   a first actuator configured to move the first plate and the probe tip in the y-axis direction wherein the first actuator includes a comb drive actuator coupled to the second plate;
   a second actuator configured to move the first plate and the probe tip in a z-axis direction; and
   a third actuator configured to move the probe tip in the x-axis direction, the first, second and third actuators cooperating to move the probe tip with three degrees of freedom of movement, wherein the third actuator includes a comb drive having a first set of fingers coupled to a third plate, the first set of fingers coupled to the third plate cooperating with a second set of fingers coupled to the first plate to move the first plate and the probe tip in the x-axis direction.

2. The apparatus of claim 1, further comprising a capacitance sensor configured to sense a change in capacitance upon engagement of the probe tip with a sample.

3. The apparatus of claim 2, wherein a change in capacitance measured by the capacitance sensor is used to determine at least one of deflection of the probe tip and force applied to the probe tip.

4. The apparatus of claim 1, wherein the scanning probe microscope is one of an atomic force microscope and a scanning tunneling microscope.

5. The apparatus of claim 1, further comprising a controller configured to measure an electrical measurand to determine at least one of deflection of the probe tip and force applied to the probe tip, and an electrostatic sensor located at a point of largest vibration of the apparatus, the electrostatic sensor providing an output signal coupled to a controller to reduce the effect of noise-induced vibrations on the system.

6. The apparatus of claim 1, wherein the third actuator is a monolithic comb drive actuator.

7. A scanning probe microscope apparatus comprising:
   first and second anchors rigidly coupled to a substrate;
   first and second flexures coupled to the first and second anchors, respectively;
   a first plate coupled to the first flexure;
   a second plate coupled to the first plate by at least one third flexure, the second plate being moveable relative to the substrate in an x-axis direction, a y-axis direction, and a z-axis direction;
   a probe tip coupled to the second plate;
   a third plate coupled to the first plate by at least one connecting structure, the third plate being coupled to the second anchor by the second flexure;
   a first actuator coupled to the first plate, the first actuator being configured to move the first and second plates and probe tip in the y-axis direction;
   a second actuator configured to move the third plate, the second plate and probe tip in the z-axis direction; and
   a third actuator configured to move the second plate and the probe tip in the x-axis direction.

8. The apparatus of claim 7, wherein the first actuator includes an in-plane comb drive actuator configured to move the first and second plates and the probe tip in the y-axis direction.

9. The apparatus of claim 7, wherein the second actuator is an out-of-plane actuator configured to move the third and second plates and the probe tip in the z-axis direction.

10. The apparatus of claim 7, wherein the third actuator is a monolithic comb drive actuator.

11. The apparatus of claim 7, wherein displacement of the probe tip in both the x-axis direction and y-axis direction is at least 7 μm.

12. The apparatus of claim 7, further comprising a controller configured to measure an electrical measurand to determine at least one of deflection of the probe tip and force applied to the probe tip, and an electrostatic sensor located at a point of largest vibration of the apparatus, the electrostatic sensor providing an output signal coupled to a controller to reduce the effect of noise-induced vibrations on the system.

13. The apparatus of claim 7, wherein an electric potential across the second actuator is produced by applying an electric potential difference between the first and second anchors.

14. The apparatus of claim 7, further comprising a capacitance meter coupled to the first and second anchors, the capacitance meter sensing change in capacitance upon engagement of the probe tip with a sample to determine at least one of deflection of the probe tip and force applied to the probe tip.

15. A scanning probe microscope having three degrees of freedom of movement comprising:
   first and second anchors rigidly coupled to a substrate;
   first and second flexures coupled to the first and second anchors, respectively;
   a first plate coupled to the first flexure;
   a first drive actuator coupled to the first plate;
   an electrode coupled to the first plate;
   a second plate coupled to the first plate by a third flexure;
   a third plate coupled to the first plate by at least one structure, the third plate also being coupled to the second anchor by the second flexure;
   a second drive actuator located between the second and third plates; and
   a probe tip coupled to the second plate, wherein the first and second flexures and the first drive actuator provide a first degree of freedom of movement of the probe tip, the electrode provides a second degree of freedom of movement of the probe tip, and the third flexure and the second drive actuator provide a third degree of freedom of movement of the probe tip.

16. The apparatus of claim 15, wherein an electric potential across the second drive actuator is produced by applying an electric potential difference between the first and second anchors.

17. The apparatus of claim 16, further comprising a capacitance meter coupled to the first and second anchors, the capacitance meter sensing change in capacitance caused by deflection of the third flexure upon engagement of the probe tip with a sample.

18. The apparatus of claim 17, wherein a change in capacitance measured by the capacitance meter is used to determine at least one of deflection of the probe tip and force applied to the probe tip.

19. The apparatus of claim 15, wherein the scanning probe microscope is one of an atomic force microscope and a scanning tunneling microscope.

20. The apparatus of claim 15, wherein the second drive actuator is a monolithic comb drive actuator.

* * * * *